(12) United States Patent
Yoon

(10) Patent No.: US 8,698,265 B2
(45) Date of Patent: Apr. 15, 2014

(54) IMAGE SENSOR INCLUDING A LIGHT SHIELDING PATTERN

(75) Inventor: Junho Yoon, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 313 days.

(21) Appl. No.: 13/095,232

(22) Filed: Apr. 27, 2011

(65) Prior Publication Data

US 2012/0001286 A1    Jan. 5, 2012

(30) Foreign Application Priority Data

Jun. 30, 2010   (KR) .......................... 10-2010-0062509

(51) Int. Cl.
*H01L 31/0232* (2006.01)

(52) U.S. Cl.
USPC .................................. 257/435; 257/E31.122

(58) Field of Classification Search
None
See application file for complete search history.

(56) References Cited

U.S. PATENT DOCUMENTS

| | | |
|---|---|---|
| 5,244,817 A | 9/1993 | Hawkins et al. |
| 2007/0207566 A1 | 9/2007 | Fu et al. |
| 2008/0308890 A1* | 12/2008 | Uya .............................. 257/437 |
| 2009/0090988 A1* | 4/2009 | Ohgishi ....................... 257/432 |
| 2010/0155868 A1* | 6/2010 | Jang ............................. 257/432 |
| 2010/0201834 A1* | 8/2010 | Maruyama et al. ........ 348/222.1 |

FOREIGN PATENT DOCUMENTS

| | | |
|---|---|---|
| KR | 1020050047481 A | 5/2005 |
| KR | 1020080113482 A | 12/2008 |

* cited by examiner

*Primary Examiner* — Wensing Kuo

(74) *Attorney, Agent, or Firm* — F. Chau & Associates, LLC

(57) ABSTRACT

Provided are an image sensor and a package including the same. The image sensor may include an interconnection layer comprising a plurality of interconnections that are vertically stacked, a light penetration layer including color filters and microlenses, a semiconductor layer disposed between the interconnection layer and the light penetration layer and including photoelectrical transformation elements and a light shielding pattern disposed between the light penetration layer and the semiconductor layer. A surface of the semiconductor layer adjacent to the light penetration layer defines a recess region recessed toward the interconnection layer. The light shielding pattern is formed in the recess region and at least one of the photoelectrical transformation elements is formed in the semiconductor layer between the light shielding pattern and the interconnection layer.

17 Claims, 24 Drawing Sheets ical Field

The present disclosure herein relates to image sensors and packages including the same, and more particularly, to an image sensor including a light shielding pattern and a package including the same.

(ii) Description of the Related Art

An image sensor may convert an optical image to an electric signal. With the recent developments in the computer industry and the communication industry, an image sensor having increased performance is being increasingly required in various fields and products such as, for example, a digital camera, a camcorder, a personal communication system (PCS), a game machine, a security camera, a medical micro camera, etc.

Image sensors are typically characterized as either charge coupled device (CCD) or complementary metal-oxide semiconductor (CMOS) image sensors. Since the CMOS image sensor has a relatively simple driving method and can integrate a signal processing circuit in a single chip, a miniaturization of a product is possible. In addition, since the CMOS image sensor consumes very low power, it may be relatively easy to apply it to a product having a limited battery capacity. Also, since a process technology of manufacturing the CMOS image sensor may be compatible with a CMOS process technology, manufacturing costs may be lowered. Thus, as high resolution can be realized in a CMOS image sensor with a technology development, the CMOS image sensor is being increasingly used.

SUMMARY

Embodiments of the inventive concept provide an image sensor. The image sensor may include an interconnection layer comprising a plurality of interconnections that are vertically stacked, a light penetration layer including color filters and microlenses, a semiconductor layer disposed between the interconnection layer and the light penetration layer and including photoelectrical transformation elements and a light shielding pattern disposed between the light penetration layer and the semiconductor layer. A surface of the semiconductor layer adjacent to the light penetration layer defines a recess region recessed toward the interconnection layer. The light shielding pattern is formed in the recess region and at least one of the photoelectrical transformation elements is foamed in the semiconductor layer between the light shielding pattern and the interconnection layer.

Embodiments of the inventive concept also provide an image sensor. The image sensor may include an interconnection layer including a plurality of interconnections, a light penetration layer comprising color filters and microlenses, a semiconductor layer in which active pixel sensors and reference pixel sensors are formed, the semiconductor layer being disposed between the interconnection layer and the light penetration layer and a light shielding pattern disposed between the light penetration layer and the reference pixel sensors. A distance between the interconnection layer and the light shielding pattern is smaller than a distance between the interconnection layer and the light penetration layer.

Embodiments of the inventive concept also provide an image sensor package. The image sensor package may include an interconnection substrate including external connection terminals, an image sensor chip integrated onto a top surface of the interconnection substrate. The image sensor chip may include an interconnection layer including a plurality of interconnections, a light penetration layer including color filters and microlenses, a semiconductor layer in which active pixel sensors and the reference pixel sensors are formed, the semiconductor layer being disposed between the interconnection layer and the light penetration layer and a light shielding pattern disposed between the light penetration layer and the reference pixel sensors. A distance between the interconnection layer and the light shielding pattern is smaller than a distance between the interconnection layer and the light penetration layer.

Embodiments of the inventive concept also provide an image sensor which includes a support substrate, an interconnection layer adhered to the support substrate, the interconnection layer including a plurality of interlayer insulating layers and a plurality of metal interconnections which are vertically stacked in the interlayer insulating layers, a semiconductor layer doped with an impurity of a first conductivity-type and having first side and second side, the first side of the semiconductor layer being formed on interconnection layer. The semiconductor layer includes device isolation layers defining active regions, a light receiving region, a light shielding region, a pad region, photoelectrical transformation elements formed in the light shielding region on the first side of the semiconductor layer and a recess region formed in the semiconductor layer recessed from the second side of the semiconductor layer toward to the interconnection layer and defined in the light shielding region and the pad region. The photoelectrical transformation elements include an impurity region of a second conductivity-type different from the first conductivity-type and an impurity region of the first conductivity-type sequentially stacked in the semiconductor layer adjacent to the first side of semiconductor layer. The image sensor further includes a light shielding pattern formed in at least a portion of the recess region defined in the light shielding region, a conductive pad formed in a portion of the recess region defined in the pad region and spaced apart from the light shielding pattern, a buffer insulating layer conformally formed on the second side of the semiconductor layer in which the recess region is defined, a high concentration impurity layer slightly doped disposed along the second side of the semiconductor layer under the buffer insulating layer, a light penetration layer disposed on the buffer insulating layer. The light penetration layer includes a lower flat layer disposed on the buffer layer, a plurality of color filters disposed on the lower flat layer, an upper flat layer disposed on the color filters and a plurality of microlenses disposed on the upper flat layer. The image sensor further includes a buried layer formed between the lower flat layer of the light penetrating layer and the light shielding pattern formed in the recess region.

BRIEF DESCRIPTION OF THE FIGURES

Exemplary embodiments of the inventive concept may be understood in further detail from the following detailed description taken in conjunction with the attached drawing in which.

DETAILED DESCRIPTION OF EXEMPLARY EMBODIMENTS

Preferred embodiments of the inventive concept will be described below in more detail with reference to the accompanying drawings. The embodiments of the inventive concept may, however, be embodied in different forms and should not be construed as limited to the embodiments set forth herein. Like numbers refer to like elements throughout.

The terminology used herein is for the purpose of describing particular embodiments only and is not intended to be limiting of the invention.

Figure 1:
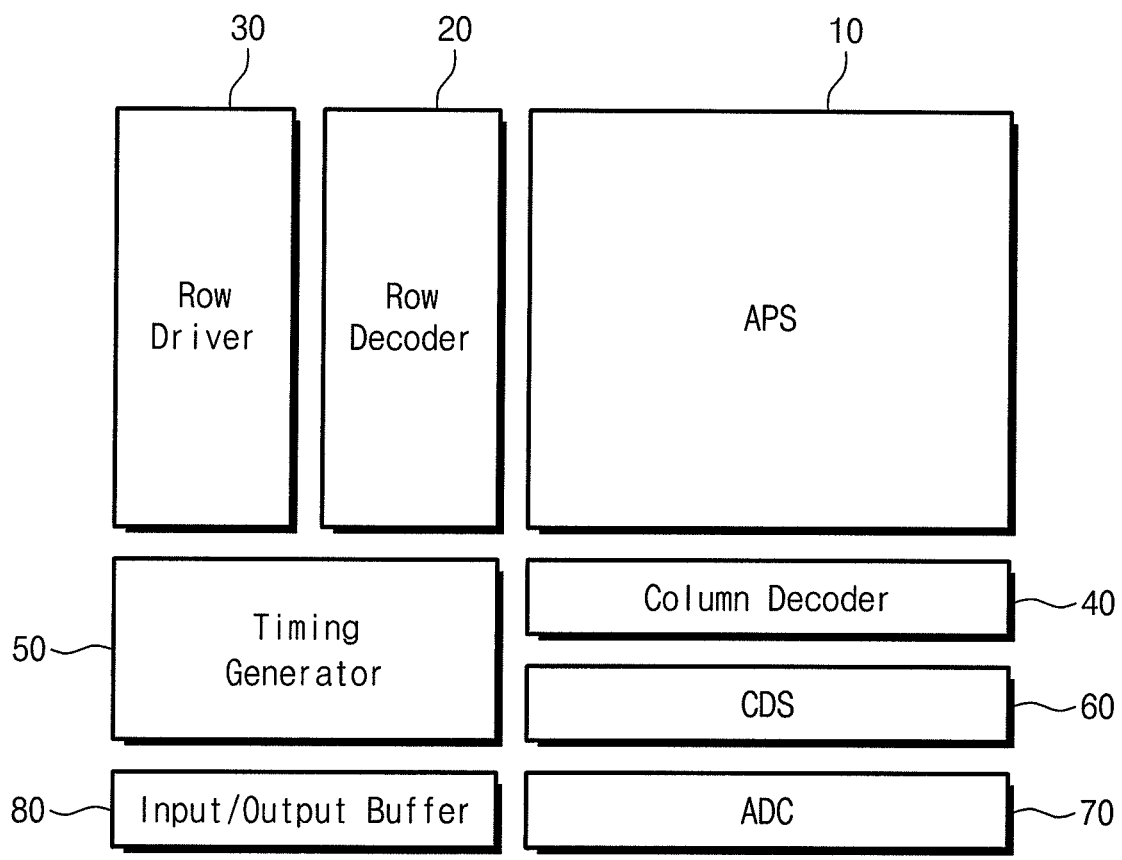
FIG. 1 is a block diagram of an image sensor in accordance with an exemplary embodiment of the inventive concept.
Figure 2:
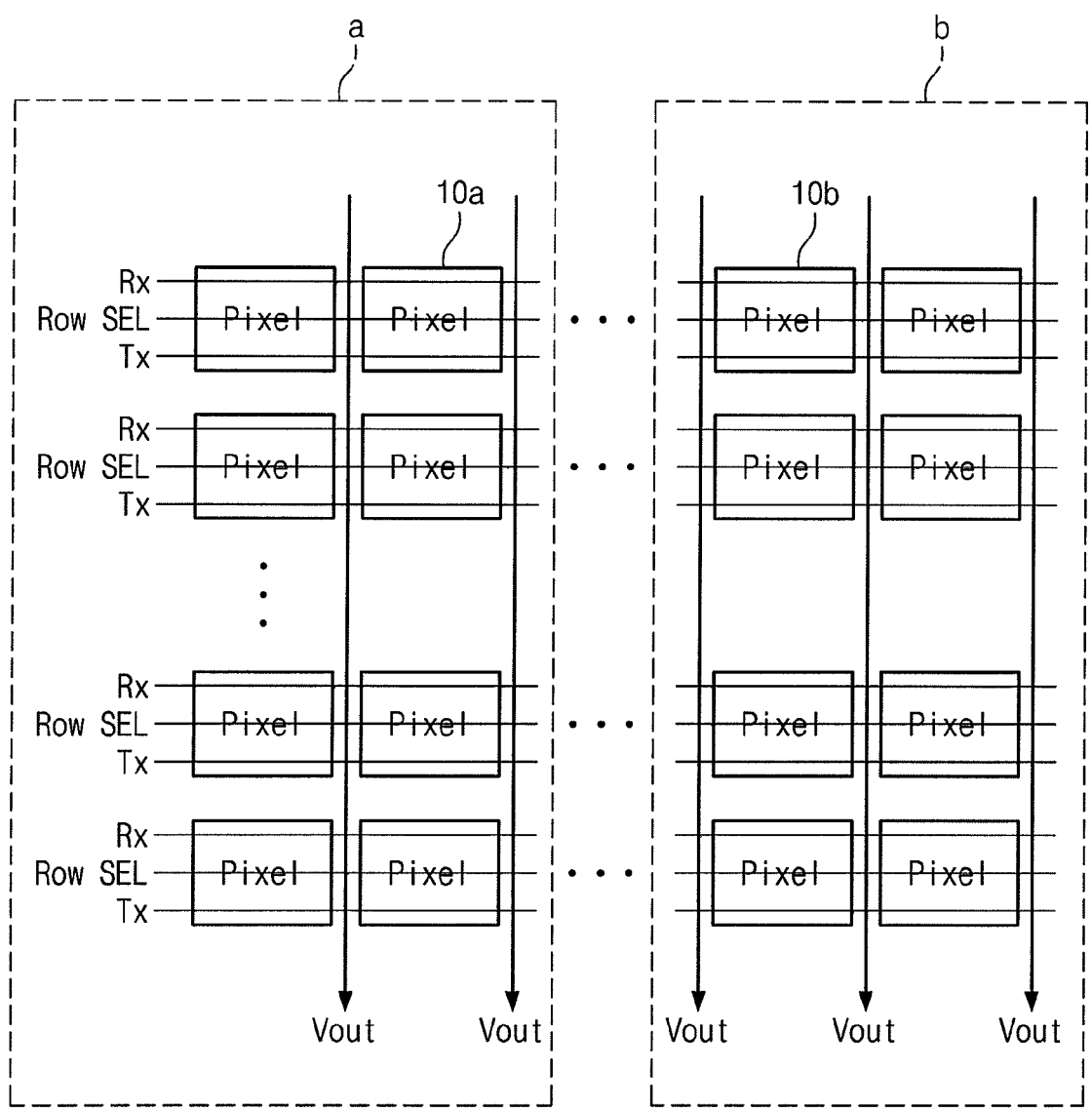
FIG. 2 is a circuit diagram of APS array of an image sensor in accordance with an exemplary embodiment of the inventive concept.

FIG. 1 is a block diagram of an image sensor in accordance with embodiments of the inventive concept. FIG. 2 is a circuit diagram of APS array of an image sensor in accordance with embodiments of the inventive concept.

Referring to FIG. 1, an image sensor in accordance with embodiments of the inventive concept may include, for example, an active pixel sensor (APS) array 10, a row decoder 20, a row driver 30, a column decoder 40, a timing generator 50, a correlated double sampler (CDS) 60, an analog digital converter (ADC) 70 and an input/output buffer 80.

Referring to FIG. 2, the APS array 10 includes a light receiving region (a) and a light shielding region (b), and unit pixels are two-dimensionally arranged. Unit pixels (e.g., active pixel sensors 10a) of the light receiving region (a) convert an incident light to an electric signal and unit pixels (e.g., reference pixel sensors 10b) of the light shielding region (b) output an electric signal generated from light shielding unit pixels. Also, unit pixels of the light receiving region (a) and the light shielding region (b) may be driven by a plurality of driving signals such as a row select signal (Row SEL), a reset signal (Rx) and a charge transmitting signal (Tx) that are provided from the row driver 30. An electric signal generated from the APS array 10 is provided to the correlated double sampler (CDS) 60.

The row driver 30 provides a plurality of driving signals for driving a plurality of unit pixels to the APS array 10 according to a result decoded in the row decoder 20. In the case that unit pixels are arranged in row, the driving signals may be provided to pixels by each row.

The correlated double sampler (CDS) 60 receives an electric signal generated from the APS array 10, and then holds and samples the electric signal. The correlated double sampler (CDS) 60 doubly samples a specific noise level and a signal level of an electric signal to output a difference level between the noise level and the signal level.

The analog digital converter (ADC) 70 converts an analog signal corresponding to the difference level outputted from the correlated double sampler (CDS) 60 to a digital signal, and then outputs the digital signal.

The input/output buffer 80 latches a digital signal and the latched signal is outputted to an image signal processing portion (not shown) according to a decoding result in the column decoder 40.

Figure 3:
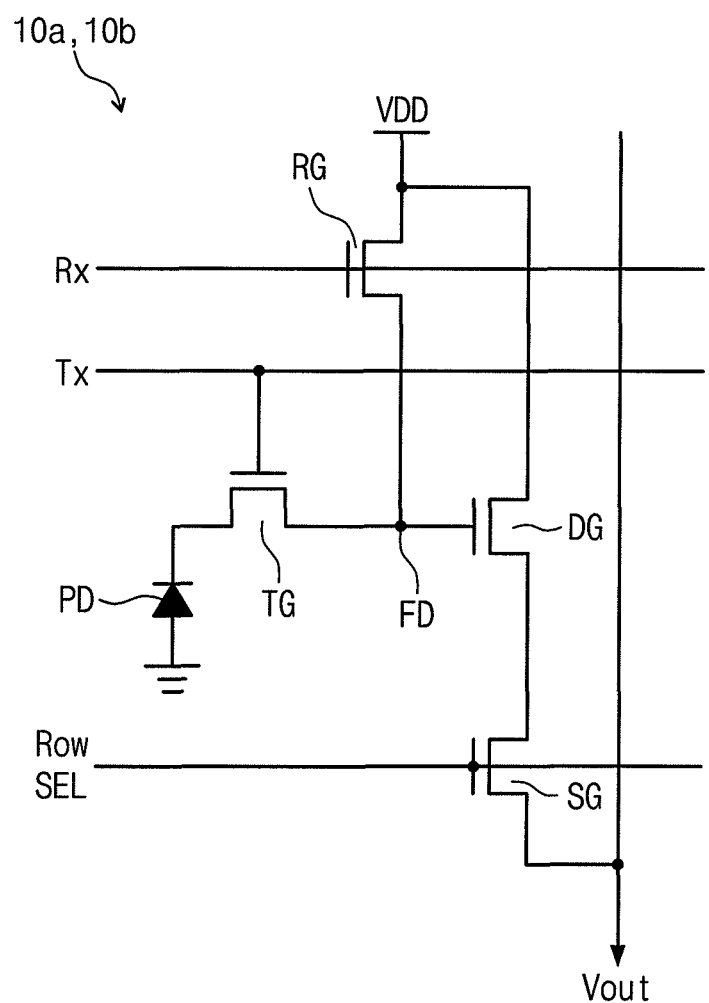
FIG. 3 is a circuit diagram of unit pixel of an image sensor in accordance with an exemplary embodiment of the inventive concept.

FIG. 3 is a circuit diagram of unit pixel of an image sensor in accordance with embodiments of the inventive concept.

Referring to FIG. 3, a unit pixel includes a photoelectric transformation element (PD) converting an incident light to an electric signal and a readout device reading out an electric signal generated from the photoelectric transformation element (PD). The readout device may include, for example, a charge transfer device (TG), a reset device (RG), a drive device (DG), a select device (SG), etc. Driving signal lines (Tx, Rx) and a row select line (ROW SEL) of the charge transfer device (TG), the reset device (RG) and the select device (SG) are connected to unit pixels included in a same row in common.

For example, the photoelectric transformation element (PD) can generate and accumulate charges corresponding to an incident light. For example, the photoelectric transformation element (PD) may include a photo diode, a photo transistor, a photo gate, a pinned photo diode (PPD) and combinations thereof. The photoelectric transformation element (PD) is connected to the charge transfer device (TG) transferring the accumulated charges to a floating diffusion region (FD).

The floating diffusion region (FD) receives the accumulated charges from the photoelectric transformation element (PD). Since the floating diffusion region (FD) has a parasitic capacitance, charges are accumulated to be stored. Also, the floating diffusion region (FD) is electrically connected to the drive device (DG) to control the drive device (DG).

The charge transfer device (TG) transfers charges from the photoelectric transformation element (PD) to the floating diffusion region (FD). The charge transfer device (TG) is constituted by one transistor and is controlled by a charge transfer signal (TX).

The reset device (RG) resets the floating diffusion region (FD) periodically and is controlled by a reset signal (Rx). A source of the reset device (RG) is connected to the floating diffusion region (FD) and a drain of the reset device (RG) is connected to a power supply voltage Vdd. Thus, if the reset device (RG) is turned off by a reset signal (Rx), the power supply voltage Vdd connected to the drain of the reset device (RG) is transferred to the floating diffusion region (FD).

The drive device (DG) is combined with a constant current source (not illustrated) to function as a source follower buffer amplifier. The drive device (DG) amplifies a variation of electric potential of the floating diffusion region (FD) receiving photocharges accumulated in the photoelectric transformation element (PD) and outputs the amplified variation to an output line (Vout).

The select device (SG) performs a function of selecting unit pixels to be read by a row unit. The select device (SG) is driven by a pixel select signal (ROW SEL). If the select device (SG) is turned on, the power supply voltage Vdd connected to a drain of the select device (SG) is transferred to a drain of the drive device (DG).

According to an embodiment illustrated in FIG. 3, a unit pixel is constituted by a four-transistor structure. However, a unit pixel may be constituted by, for example, a three-transistor structure, a five-transistor structure or a photogate structure similar to the four-transistor structure.

Figure 4:
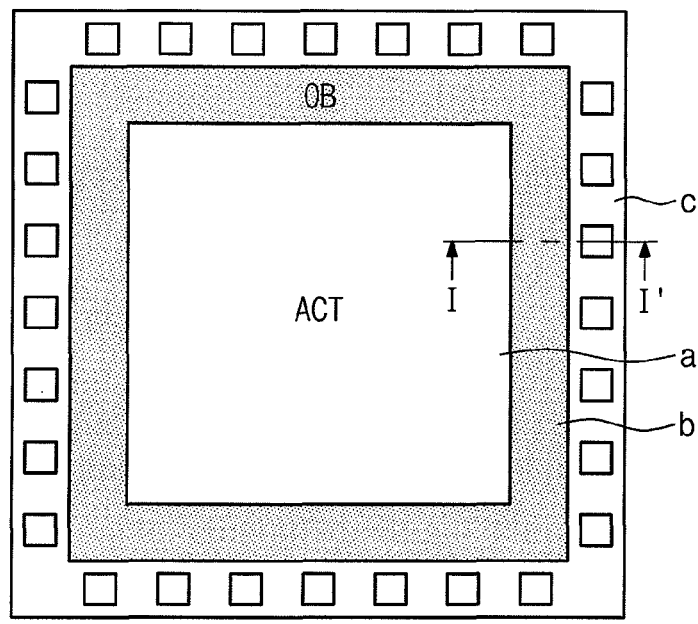
FIGS. 4 and 5 are top plan views of an image sensor in accordance with an exemplary embodiment of the inventive concept.
Figure 5:
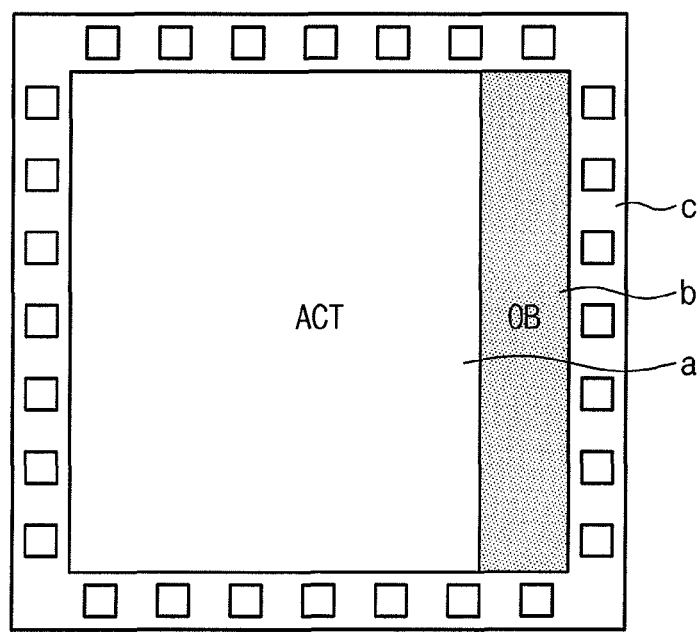

FIGS. 4 and 5 are top plan views of an image sensor in accordance with an embodiment of the inventive concept.

Referring to FIGS. 4 and 5, an image sensor includes an APS array region (a, b) and a pad region (c). As described with reference to FIG. 2, a plurality of unit pixels arranged in a matrix shape is disposed in the APS array region (a, b) and outputs an electric signal generated by an incident light. The pad region (c) includes a plurality of conductive pads used to input/output control signals and photoelectric signals to/from the APS array region (a, b). The pad region (c) may be disposed around the APS array region (a, b), making it relatively easy to electrically contact external devices. That is, the pad region (c) may be disposed at an edge portion of the image sensor.

Also, the APS array region (a, b) in which unit pixels are arranged includes a light receiving region (a) and a light shielding region (b). According to embodiments, the light shielding region (b) is disposed between the light receiving region (a) and the pad region (c). The light shielding region (b), as illustrated in FIG. 4, may be disposed around the light receiving region (a). Alternatively, the light shielding region (b), as illustrated in FIG. 5, may be disposed at one side portion of the light receiving region (a).

The light receiving region (a) outputs an electric signal generated by an incident light entering unit pixels (e.g., active pixel sensors). The light receiving region (a) may output not only an electric signal generated by an incident light but also an electric signal (e.g., a noise signal) generated by electrons created by a heat generation. That is, an electric signal outputted from the light receiving region (a) may include not only a photoelectric signal but also a noise signal.

A light cannot enter unit pixels (e.g., reference pixel sensors) of the light shielding region (b) by a light shielding pattern. That is, since a light cannot enter unit pixels in the light shielding region (b), only an electric signal (a noise signal) generated by electrons created by a heat generation can be outputted. If using an electric signal generated from the light shielding region (b), a photoelectric signal that a noise signal is removed from an electric signal outputted from the light receiving region (a) can be outputted from the image sensor. Also, the reference signal generated from the light shielding region (b) may be an average value of electric signals outputted from unit pixels of the light shielding region (b) for the sake of accuracy.

Figure 6:
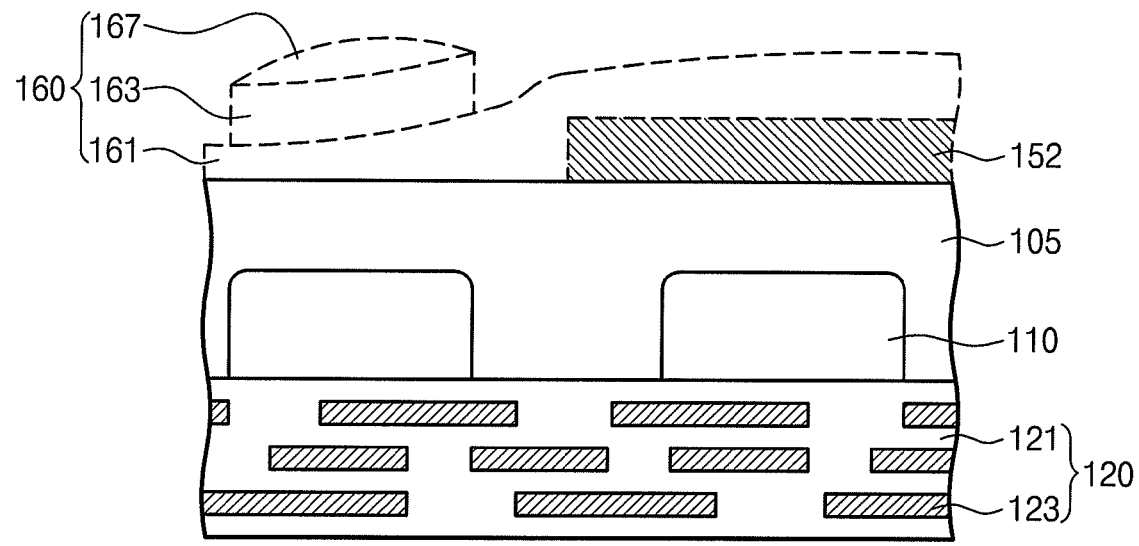
FIGS. 6 and 7 are cross-sectional views for explaining an image sensor in accordance with an exemplary embodiment of the inventive concept.
Figure 7:
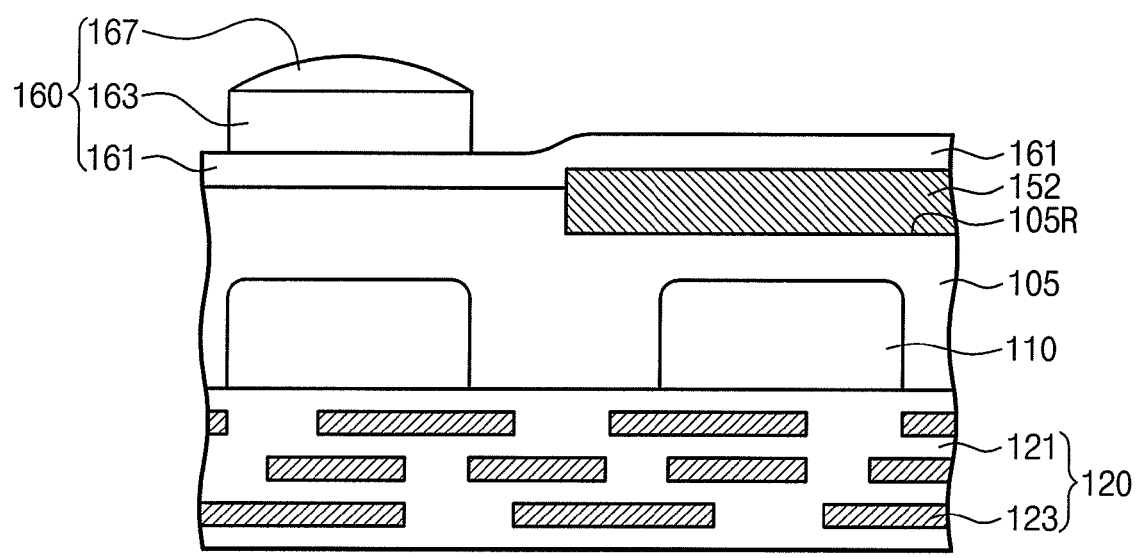

FIGS. 6 and 7 are cross-sectional views for explaining an image sensor in accordance with embodiments of the inventive concept.

Referring to FIGS. 6 and 7, an image sensor in accordance with embodiments of the inventive concept includes an interconnection layer 120, a light penetration layer 160, a semiconductor layer 105 and a light shielding pattern 152.

The interconnection layer 120 includes a plurality of metal interconnections 123 vertically stacked. For example, the interconnection layer 120 includes the readout devices and the control devices described with reference to FIG. 1. That is, the interconnection layer 120 includes the row decoder 20, the row driver 30, the column decoder 40, the timing generator 50, the correlated double sampler (CDS) 60, the analog digital converter (ADC) 70 and the input/output buffer 80 that are illustrated in FIG. 1. Also, the interconnection layer 120 may include the readout devices constituting a unit pixel described with reference to, for example, FIG. 3.

The light penetration layer 160 is disposed on the interconnection layer 120 and includes color filters 163 and a microlens 167 on the color filters 163. The light penetration layer 160 may also include flat layers 161.

The semiconductor layer 105 is disposed between the interconnection layer 120 and the light penetration layer 160 in a vertical height. The semiconductor layer 105 may include a first side (1) adjacent to the interconnection layer 120 and a second side (2) adjacent to the light penetration layer 160. Also, the semiconductor layer 105 includes a light receiving region (a) and a light shielding region (b) and photoelectric transformation elements 110 may be formed in the semiconductor layer 105.

The light shielding pattern 152 covers an upper portion of the photoelectric transformation elements 110 disposed in the light shielding region (b). The area of the light shielding pattern 152 may be substantially the same as the area of the light shielding region (b). The light shielding pattern 152 may be disposed between the semiconductor layer 105 and the light penetration layer 160 in a vertical height. For example, the light penetration pattern 152 may be disposed between the photoelectric transformation elements 110 of the light shielding region (b) and the light penetration layer 160 in a vertical height and the flat layer 161 of the light penetration layer 160 may cover the light shielding pattern 152. The light shielding pattern 152 includes a top surface and a lower surface facing each other. In embodiments of the inventive concept, a surface adjacent to the light penetration layer 160 is defined as a top surface of the light shielding pattern 152 and a surface adjacent to the interconnection layer 120 is defined as a lower surface of the light shielding pattern 152.

According to an embodiment illustrated in FIG. 6, the light shielding pattern 152 may be formed on the second side (2) of the semiconductor layer 105 and the flat layer 161 may be conformally formed on the second side (2) of the semiconductor layer 105 including the light shielding pattern 152. In this case, the flat layer 161 may have an inclined plane by a height difference between the second side (2) of the semiconductor layer 105 and the top surface of the light shielding pattern 152. For example, the flat layer 161 may have an inclined plane at the light receiving region (a) adjacent to the light shielding region (b). As the thickness of the light shielding pattern 152 becomes greater, the slope of the flat layer 161 with respect to the second side (2) of the semiconductor layer 105 may increase. In the case that the color filters 163 and the microlenses 167 are formed on the flat layer 161 having an inclined portion, as illustrated in the drawing, the color filters 163 and the microlenses 167 may also have a slope with respect to the semiconductor layer 105.

In the case that the microlenses 167 changing a path of a light entering the light receiving region (a) to concentrate the light on the photoelectric transformation elements 110 is formed to be inclined, an incident light may not be concentrated on the photoelectric transformation elements 110 of the light receiving region (a) but may enter the photoelectric transformation elements 110 of the light shielding region (b). Thus, charges may be created in the photoelectric transformation elements 110 of the light shielding region (b) due to the incident light. As a result, the accuracy of reference signal outputted from the light shielding region (b) may be deteriorated and an electric signal outputted from the APS array may be distorted.

The thickness of the light shielding pattern 152 may be reduced to decrease a height difference between the second side (2) of the semiconductor layer 105 and the top surface of the light shielding pattern 152. However, in the case that the thickness of the light shielding pattern 152 is reduced, an incident light may penetrate the light shielding pattern 152. Therefore, the height difference between the second side (2) of the semiconductor layer 105 and the top surface of the light shielding pattern 152 should be reduced while the light shielding pattern 152 has a predetermined thickness that can completely shield an incident light.

According to embodiments of the inventive concept, as illustrated in FIG. 7, at least a portion of the light shielding pattern 152 may be inserted into the semiconductor layer 105 to reduce the height difference between the second side (2) of the semiconductor layer 105 and the top surface of the light shielding pattern 152. That is, the thickness of the semiconductor layer 105 in the light shielding region (b) is smaller than the thickness of the semiconductor layer 105 in the light receiving region (a).

For example, the second side (2) of the semiconductor layer 105 may have a recess region 105R in the light shielding region (b) and the light shielding pattern 152 may be formed in the recess region 105R. That is, a bottom surface of the light shielding region 152 may be disposed between the first side (1) and the second side (2) of the semiconductor layer 105 in the light receiving region (a). In a vertical height, a top surface of the light shielding pattern 152 may be higher than the semiconductor layer 105 of the light receiving region (a). Alternatively, a top surface of the light shielding pattern 152 may be disposed between the first side (1) and the second side (2) of the semiconductor layer 105 in the light receiving region (a). In this case, the light shielding pattern 152 may have a buried structure in the semiconductor layer 105.

According to embodiments of the inventive concept, the height difference that occurred between the semiconductor layer 105 and the light shielding pattern 152 due to the thickness of the light shielding pattern 152 may be reduced by the recess depth of the recess region 105R formed in the semiconductor layer 105.

FIGS. 8 through 12 are cross-sectional views of an image sensor taken along the line I-I' of FIG. 4 in accordance with an embodiment of the inventive concept.

Figure 8:
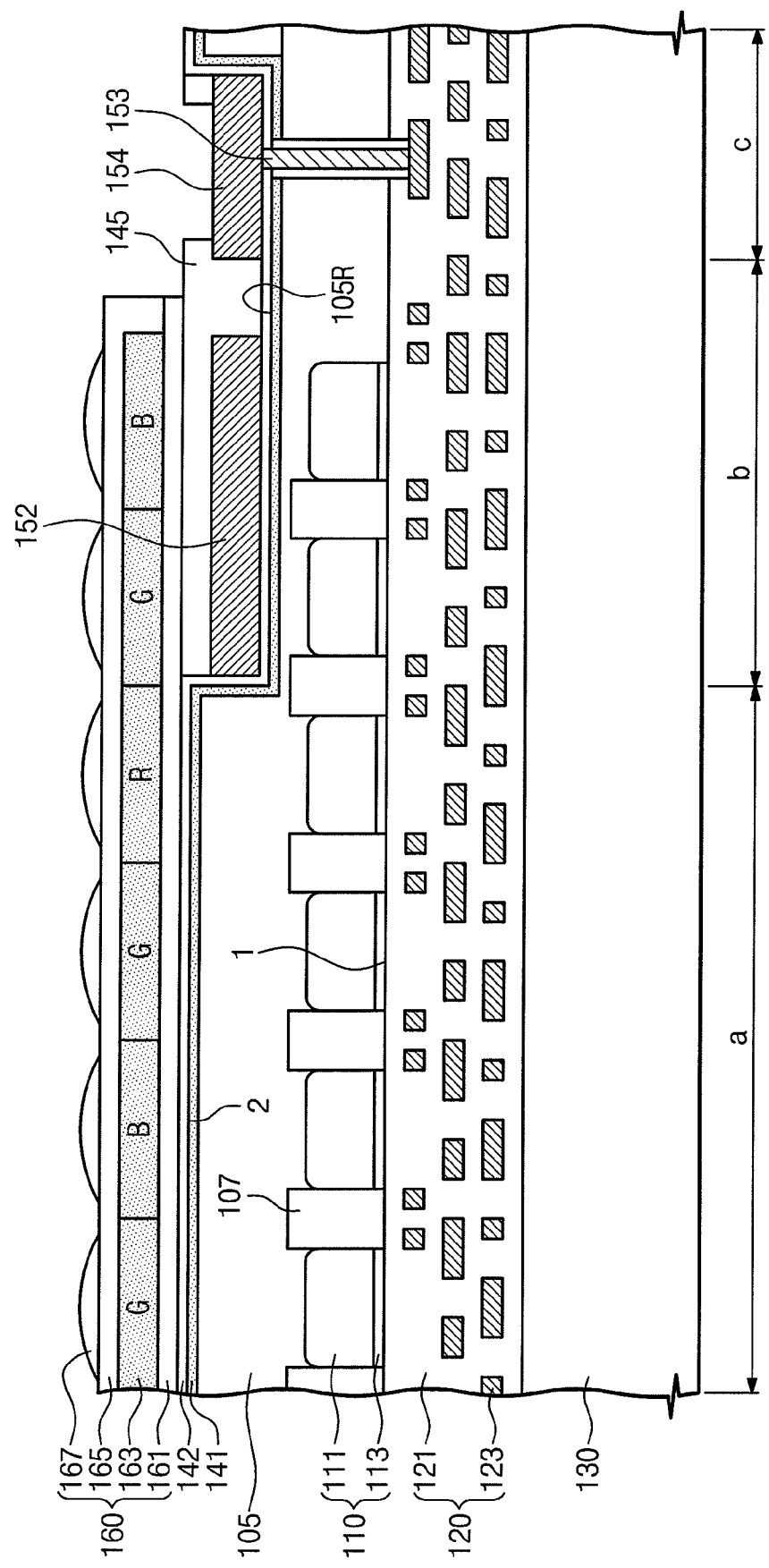
FIGS. 8 through 12 are cross-sectional views of an image sensor taken along the line I-I' of FIG. 4 in accordance with an exemplary embodiment of the inventive concept.

Referring to FIG. 8, an image sensor includes an interconnection layer 120, a semiconductor layer 105 between the interconnection layer 120 and a light penetration layer 160 and a light shielding pattern 152. Here, the semiconductor layer 105 has a first side (1) adjacent to the interconnection layer 120 and a second side (2) adjacent to the light penetration layer 160.

For example, the semiconductor layer 105, as described with reference to FIGS. 4 and 5, includes an APS array region (a, b) and a pad region (c). The APS array region (a, b) includes a light receiving region (a) and a light shielding region (b) between the light receiving region (a) and the pad region (c).

The semiconductor layer 105 may be a p-type epitaxial layer. The semiconductor layer 105 may also be a bulk semiconductor substrate including a p-type well. In an embodiment of the inventive concept, the semiconductor layer 105 is assumed to be a p-type epitaxial layer. However, it is not limited thereto and may be various types of semiconductor layers 105 such as, for example, an n-type epitaxial layer, a bulk silicon substrate, a SOI substrate, etc.

A light entering the image sensor from the outside has a different penetration depth into the semiconductor layer 105 according to a wavelength range of the light. Thus, the thickness of the semiconductor layer 105 may be determined according to the wavelength range of light entering into the light receiving region (a). For example, the semiconductor layer 105 may have a thickness of about 1 μm to about 5 μm.

The semiconductor layer 105 may include device isolation layers 107 defining active regions. Photoelectric transformation elements 110 are formed in the active regions.

The photoelectric transformation elements 110 may be, for example, two dimensionally disposed in the light receiving region (a) and the light shielding region (b). The photoelectric transformation elements 110 in the light receiving region (a) and the light shielding region (b) may have, for example, the same structure. The photoelectric transformation elements 110 may have, for example, a vertical thickness smaller than that of the device isolation layers 107.

According to an embodiment of the inventive concept, a photodiode may be formed from the photoelectric transformation element 110 by a joining of the semiconductor layer 105 composed of a p-type epitaxial layer and an n-type impurity region 111 of the photoelectric transformation element 110 doped with an n-type impurity in the semiconductor layer 105. According to another embodiment, a pinned photodiode may be formed from the photoelectric transformation element 110. In an embodiment, the photoelectric transformation element is formed of the n-type impurity region 111 and a p-type impurity region 113 formed in the semiconductor layer and sequentially stacked on the first side of the semiconductor layer 105. For example, a pinned photodiode may have a pnp junction structure such that the semiconductor layer 105 composed of a p-type epitaxial layer 105, the n-type impurity region 111 and the p-type impurity region 113 are stacked. Charges created by an incident light may be accumulated in the n-type impurity region 111 of the pinned photodiode. The p-type impurity region 113 adjacent to the first side (1) of the semiconductor layer 105 prevents a dark current by reducing an electron-hole pair (EHP) thermally created in the first side (1) of the semiconductor layer 105. According to an embodiment, the n-type impurity region 111 formed in the semiconductor layer 105 may be formed over a depth of, for example, about 1 μm to about 3 μm from the first side (1) of the semiconductor layer 105. According to an embodiment, the n-type impurity region 111 formed in the semiconductor layer 105 may be spaced apart from the second side (2) of the semiconductor layer 105 and may be adjacent to the first side (1) of the semiconductor layer 105.

Also, a floating diffusion region (not shown) that is formed by injecting an n-type impurity and spaced apart from the n-type impurity region 111 is disposed in the semiconductor layer 105. The floating diffusion region may have, for example, a lightly doped drain (LDD) structure and a double doped drain (DDD) structure.

A recess region 105R recessed from the second side (2) may be defined in the light shielding region (b) of the semiconductor layer 105. According to an embodiment, the thickness of the semiconductor layer 105 in the light receiving region (a) may be greater than a thickness of the semiconductor layer 105 in the light shielding region (b). The recess region 105R may be defined over the whole of the n-type impurity region 111 of the light shielding region (b). The recess region 105R defined in the second side (2) of the semiconductor layer 105 may extend from the light shielding region (b) to the pad region (c).

The recess region 105R may be vertically spaced apart from the photoelectric transformation elements 110. The recess region 105R may expose the n-type impurity region 111 in the semiconductor layer 105. In the case that a thickness of the device isolation layer 107 is greater than a thickness of the n-type impurity region 111, the recess region 105R may expose the device isolation layer 107.

A buffer insulating layer 142 is conformally formed on the second side (2) of the semiconductor layer 105 in which the recess region 105R is defined. For example, the buffer insulating layer 142 may be a thermal oxide layer formed by a thermal oxidation process, a chemical vapor deposition (CVD) oxide layer formed by a chemical vapor deposition (CVD) method or a chemical oxide layer formed by a reaction of the second side of the semiconductor layer 105 to a chemical solution. The buffer insulating layer 142 may have a thickness of, for example, about 1 μm to about 5 μm. The buffer insulating layer 142 may remove surface defects and interface traps existing on the second side (2) of the semiconductor layer 105. Thus, due to defects of the second side (2) of the semiconductor layer 105, an electric potential on the second side (2) is lowered to reduce a formation of depletion well on the second side (2) of the semiconductor layer 105. The buffer insulating layer 142 is used as a reflection prevention layer, and thereby may suppress that the amount of incident light is reduced by a reflection of a light when a light is entered.

A high concentration impurity layer 141 slightly doped along the second side (2) is disposed in the semiconductor layer 105 under the buffer insulating layer 142. The high concentration impurity layer 141 may be composed of, for example, a p-type impurity such as boron (B). When the semiconductor layer 105 is a p-type epitaxial layer, an impurity concentration of the p-type high impurity layer 141 is higher than an impurity concentration of the semiconductor layer 105. The p-type high concentration impurity layer 141 may prevent that because of a dangling defect of silicon, a defect due to an etching stress or an interface trap results in an electric potential on the second side (2) being lowered to form a depletion well. The p-type high concentration impurity layer 141 may form a potential barrier that prevents charges created from the second side (2) of the semiconductor layer 105 from flowing in the photoelectrical transformation element 110. When the image sensor operates, a hole of electron-hole pair (EHP) created from the second side (2) of the semiconductor layer 105 may diffuse into the grounded semiconductor layer 105 through the p-type high concentration impurity layer 141 and an electron of electron-hole pair (EHP) is recombined with a hole to be diminished while an electron diffuses through the p-type high concentration impurity layer 141.

A light shielding pattern 152 covering the photoelectric transformation elements 110 of the light shielding region (b) is disposed in the recess region 105R where the buffer insulating layer 142 is formed. The light shielding pattern 152 has a top surface and a bottom surface facing each other. A surface adjacent to the light penetration layer 160 is defined as the top surface of the light shielding pattern 152 and a surface adjacent to the interconnection layer 120 is defined as the bottom surface of the light shielding pattern 152.

For example, the thickness of the light shielding pattern 152 may be smaller than the recess depth of the recess region 105R. That is, the thickness of the light shielding pattern 152 may be smaller than the thickness difference between the semiconductor layer 105 in the light receiving region (a) and the semiconductor layer 105 in the light shielding region (b). The light shielding pattern 152 has a thickness enough to shield an incident light. Since the ability to absorb and shield a light is different according to the metal material, the thickness of a metal layer may be different according to the specific material. For example, the recess depth of the light shielding pattern 152 may be about 500 Å to about 2000 Å. The area of the light shielding pattern 152 may be substantially the same as the area of the light shielding region (b). The light shielding pattern 152 may be formed of a metal material such as, for example, copper (Cu), aluminum (Al), tungsten (W), titanium (Ti), molybdenum (Mo), tantalum (Ta), a titanium nitride layer (TiN), a tantalum nitride layer (TaN), a zirconium nitride layer (ZrN), tungsten nitride layer (TiN) and an alloy composed of combinations thereof.

In the case that the recess 105R extends from the light shielding region (b) to the pad region (c), a conductive pad 154 may be disposed in the recess region 105R. The conductive pad 154 is spaced apart from the light shielding pattern 152 and may be formed of a metal material the same as the light shielding pattern 152. The conductive pad 154 may have the same thickness as that of the light shielding pattern 152. A top surface of the conductive pad 154 may be exposed for an electrical connection to an external device. The conductive pad 154 disposed on the pad region (c) may be connected to an interconnection of the interconnection layer 120 through a via contact hole penetrating the semiconductor layer 105. An insulating layer may be interposed between the via contact hole penetrating the semiconductor layer 105 and the semiconductor layer 105.

A buried layer 145 may fill the recess region 105R where the light shielding pattern 152 is formed. The buried layer 145 may be formed by depositing an insulating material having beneficial gap-fill characteristic. A top surface of the buried layer 145 may be planarized. A planarized top surface of the buried layer 145 may be coplanar with a top surface of the buffer insulating layer 142 on the receiving region (a). That is, the distance between the top surface of the buried layer 145 and the first side (1) of the semiconductor layer 105 may be substantially the same as the distance between the top surface of the buffer insulating layer 142 on the light receiving region (a) and the first side (1) of the semiconductor layer 105.

The buried layer 145 may be, for example, a high density plasma (HDP) oxide layer, a TEOS oxide layer, tonen silazene (TOSZ), spin on glass (SOG), undoped silica glass (USG) or a high-k dielectric layer. The buried layer 145 on the pad region (c) may have an opening exposing the conductive pad 154.

The interconnection layer 120 is disposed on the first side (1) of the semiconductor layer 105 in which the photoelectrical transformation element 110 is formed. The interconnection layer 120 includes devices transmitting and reading out an electric signal generated by the photoelectrical transformation element 110. For example, the interconnection layer 120 includes the row decoder 20, the row driver 30, the column decoder 40, the timing generator 50, the correlated double sampler (CDS) 60, the analog digital converter (ADC) 70 and the input/output buffer 80 that are illustrated in FIG. 1. The interconnection layer 120 may include gate electrodes of transistors constituting a unit pixel described with reference to FIG. 3. The interconnection layer 120 may include a plurality of interlayer insulating layers 121 and a plurality of metal interconnections 123 are vertically stacked in the interlayer insulating layers 121. The metal interconnections 123 may be connected to, for example, lower readout devices, lower logic devices and/or other interconnections through contact plugs (not illustrated).

In an embodiment, the metal interconnections 123 may be arranged regardless of an arrangement of the photoelectrical transformation element 110. That is, the metal interconnections 123 may be disposed at the same vertical line as the photoelectrical transformation element 110. The metal interconnections 123 may be electrically connected to the conductive pad 154 on the semiconductor layer 105.

The interconnection layer 120 may be disposed between the semiconductor layer 105 and a support substrate 130. The support substrate 130 may be one selected from, for example, a semiconductor substrate, a glass substrate and a plastic substrate. The support substrate 130 may adhere to the interconnection layer 120 by, for example, an adhesive layer. The support substrate 130 may prevent the semiconductor layer 105 from being bent due to a thin film conversion of the semiconductor layer 105.

The light penetration layer 160 is disposed on the second side (2) of the semiconductor layer 105. The light penetration layer 160 may include lower and upper flat layers 161 and 165 disposed on the second side (2) of the semiconductor layer 105, color filters 163 and microlenses 167. The light penetration layer 160 providing an incident light to the photoelectrical transformation elements 110 on the light receiving region (a) may be formed on the buffer insulating layer 142 and the buried layer 145 that are planarized. That is, since the light penetration layer 160 is formed on a flat structure, the color filters 163 and the microlenses 167 may be formed in parallel to the semiconductor layer 105. Thus, when a light enters the light receiving region (a) through the light penetration layer 160, the light may be prevented from being refracted and entering the light shielding region (b).

For example, the color filters 163 correspond to the photoelectrical transformation elements 110 formed in the semiconductor layer 105, respectively. According to an embodiment, the color filters 163 may be disposed on not only the light receiving region (a) but also the light shielding region (b). The color filters 163 disposed on the light shielding region (b) may be used as a dummy pattern.

According to an embodiment, a red color filter 163, a green color filter 163 or a blue color filter 163 may be disposed on the lower flat layer 161 according to a unit pixel. The color filters 163 are, for example, two dimensionally disposed like the arrangement structure of the photoelectrical transformation elements 110. For example, the red color filter 163, the green color filter 163 and the blue color filter 163 may be arranged by a Bayer shape. The color filters 163 penetrate a light of a specific color by a unit pixel to realize a color image. That is, the red color filter 163 filters visible light to penetrate a red light, the green color filter 163 filter visible light to penetrate a green light and the blue color filter 163 filter visible light to penetrate a blue light. According to another embodiment, the color filters 163 may have other colors such as, for example, cyan, magenta or yellow.

The microlens 167 is disposed on each of the color filters 163. The microlens 167 may also be disposed on not only the light receiving region (a) but also the light shielding region (b). The microlens 167 disposed on the light shielding region (b) may be used as a dummy pattern. The microlens 167 changes a path of a light entering the outside of the photoelectrical transformation elements 110 to concentrate a light on the photoelectrical transformation elements 110. The microlens 167 may have, for example, a upward convex shape. The microlens 167 may have a specific curvature radius. The microlens 167 may be formed from, for example, a light penetrability resin.

Under the color filters 163, the lower flat layer 161 may conformally cover the second side (2) of the semiconductor layer 105 where the light shielding pattern 152 is formed. The lower flat layer 161 may be formed on the buffer insulating layer 142 and the buried layer 145 that are planarized. Also, the upper flat layer 165 called an over-coating layer (OCL) may be formed between the color filter layer 163 and the microlense 167.

The lower and upper flat layers 161 and 165 may be formed from, for example, a material having a refractive index greater than silicon oxide. For example, the lower and upper flat layers 161 and 165 may be formed from a material having a refractive index of about 1.4 to about 4.0. For instance, the lower and upper flat layers 161 and 165 may be formed from a material such as, for example, aluminum oxide ($Al_2O_3$), cerium fluoride ($CeF_3$), indium tin oxide (ITO), magnesium oxide (MgO), titanium oxide ($TiO_2$), zirconium oxide ($ZrO_2$), silicon (Si), zinc selenide (ZnSe), zinc sulfide (ZnS) or phosphonium fluoride ($PhF_2$).

The lower and upper flat layers 161 and 165 may be formed from organic matter having a high refractive index such, for example, siloxane resin, benzocyclobutene (BCB), polyimide system, acryl system, parylene C, methyl methacrylate (PMMA), polyethylene terephthalate (PET), etc.

The lower flat layer 161 may be formed from a material such as, for example, strontium titanate ($SrTiO_3$), polycarbonate, glass, bromine, sapphire, cubic, zirconia, potassium Niobate ($KNbO_3$), moissanite (SiC), gallium (III) phosphide (GaP), gallium (III) arsenide (GaAs), etc.

FIGS. 9 through 12 illustrate a cross-sectional view of an image sensor in accordance with other embodiments of the inventive concept. In the embodiments illustrated in FIGS. 9 through 12, like numbers illustrated in FIG. 8 refer to like elements throughout and the description thereof will be omitted.

Figure 9:
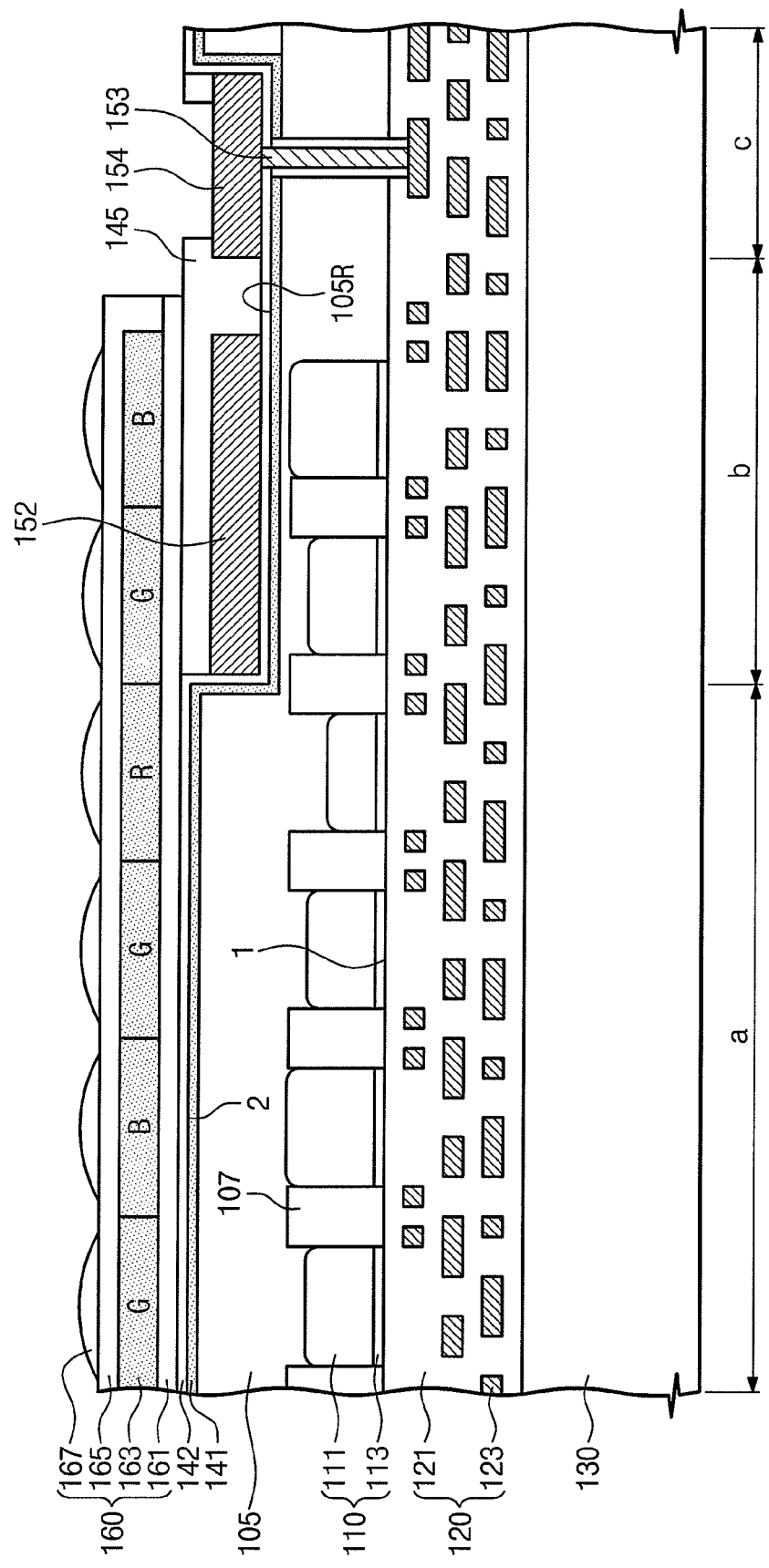

According to an embodiment illustrated in FIG. 9, the n-type impurity regions 111 constituting the photoelectrical transformation element formed in the semiconductor layer 105 may have different thicknesses from one another. In other words, distances between top surfaces of the n-type impurity regions 111 and the second side (2) of the semiconductor layer 105 may be different from one another in unit pixels. The thickness of the n-type impurity region 111 may become different according to a wavelength of a light entering each unit pixel.

For example, the longer a wavelength of a light is, the deeper a penetration depth into the semiconductor layer 105 is. In embodiments of the inventive concept, since a light enters the second side (2) of the semiconductor layer 105 and the photoelectrical transformation elements 110 are adjacent to the first side (1) of the semiconductor layer 105, a unit pixel receiving a light of a comparatively long wavelength may have the n-type impurity region 111 having a small thickness.

In the case that the light receiving region (a) includes a red pixel region, a green pixel region and a blue pixel region, the thickness of the n-type impurity region 111 from the first side (1) of the semiconductor layer 105 may be reduced in the order of the blue pixel, the green pixel and the red pixel. For example, since a red light having a wavelength range of about 630 nm to about 700 nm may have a long wavelength in visible light, a light entering the second side (2) of the semiconductor layer 105 can reach a portion adjacent to the first side (1) of the semiconductor layer 105. Since a blue light having a wavelength range of, for example, about 450 nm to about 490 nm may have a comparatively short wavelength in visible light, a light cannot reach a portion adjacent to the first side (1) of the semiconductor layer 105. Thus, in the semiconductor layer 105, the n-type impurity region 111 of a red pixel has the smallest thickness and the n-type impurity region 111 of a blue pixel has the greatest thickness. The thickness of the n-type impurity region 111 of a green pixel may be greater than that of a red pixel and smaller than that of a blue pixel. The structure of the n-type impurity region 111 like this may be equally applied to the light receiving region (a) and the light shielding region (b).

Figure 10:
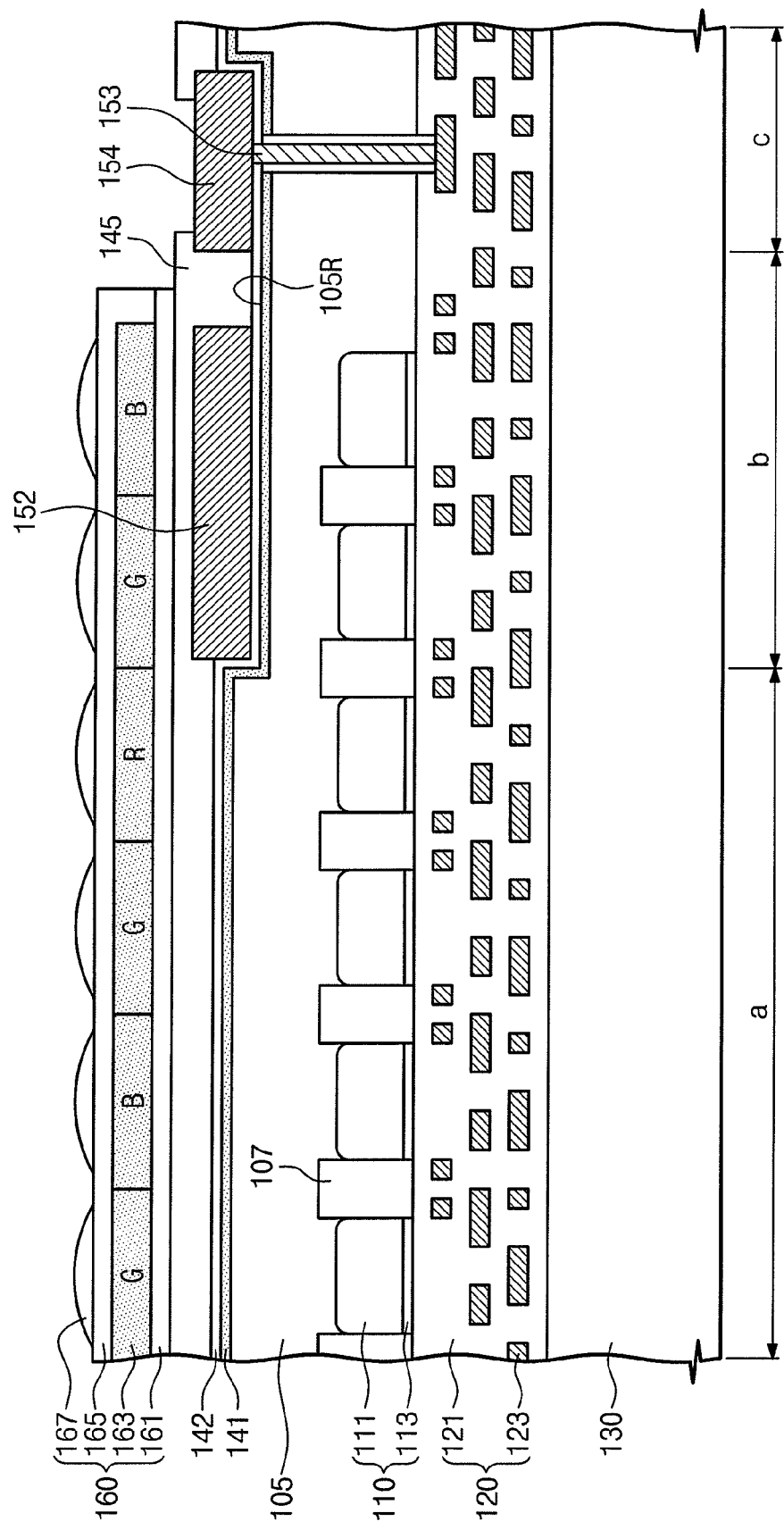

According to an embodiment illustrated in FIG. 10, a thickness of the light shielding pattern 152 may be greater than a recess depth of the recess region 105R formed by being recessed from the second side (2) of the semiconductor layer 105. That is, a portion of the light shielding pattern 152 may have a structure protruding from the recess region 105R where the buffer insulating layer 142 is formed. The conductive pad 154 having the same thickness as the light shielding pattern 152 may also have a structure protruding from the recess region 105R.

The light shielding pattern 152 may be buried in the buried layer 145 composed of an insulating material. The buried layer 145 may extend to an upper portion of the buffer insulating layer 142 on the light receiving region (a) to bury the light shielding pattern 152 protruding from the recess region 105R. The buried layer 145 may have an opening exposing a portion of top surface of the conductive pad 154.

Figure 11:
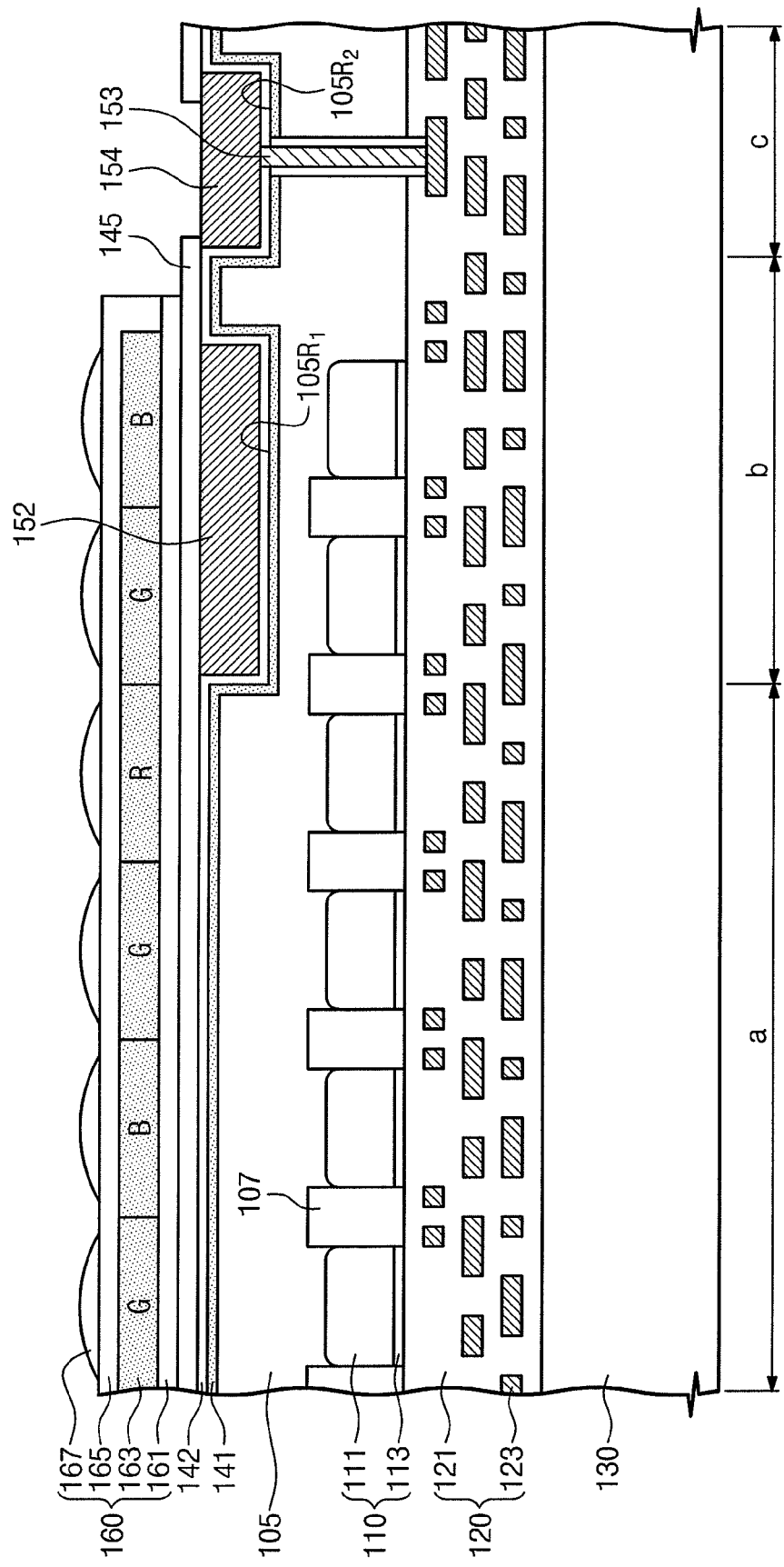

According to an embodiment illustrated in FIG. 11, the second side (2) of the semiconductor layer 105 may include a first recess region $105R_1$ on the light shielding region (b) and a second recess region $105R_2$ on the pad region (c). The first recess region $105R_1$ and the second recess region $105R_2$ may be separated from each other. The light shielding pattern 152 is buried in the first recess region $105R_1$ and the conductive pad 154 is buried in the second recess region $105R_2$.

Figure 12:
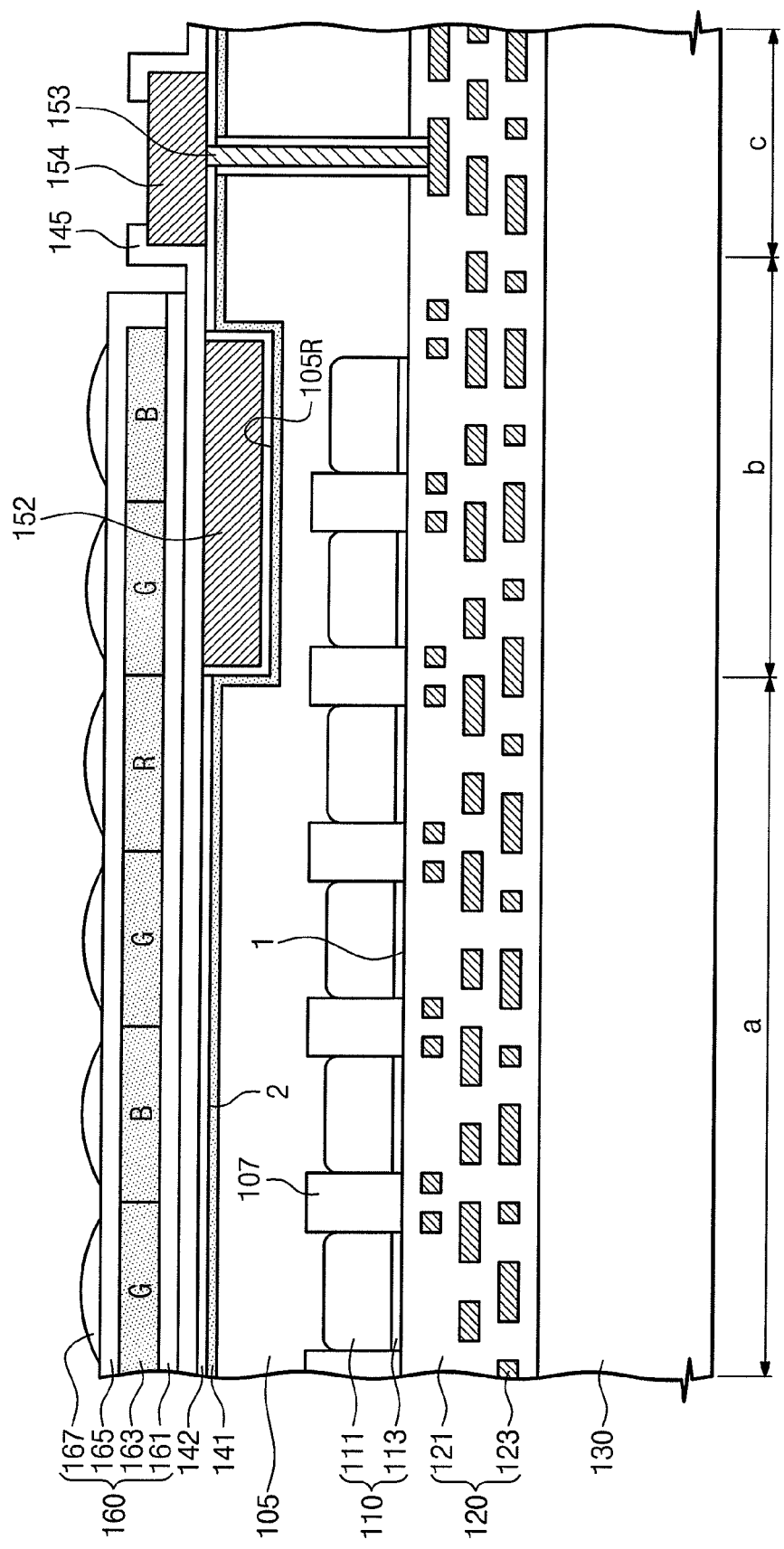

According to an embodiment illustrated in FIG. 12, the recess region 105R formed on the second side (2) of the semiconductor layer 105 may be locally formed on the light shielding region (b) and the light shielding pattern 152 is disposed in the recess region 105R. The conductive pad 154 may be disposed on the semiconductor layer 105 of the pad region (c). The buried layer 145 covering the light shielding pattern 152 may be conformally formed over the light receiving region (a), the light shielding region (b) and the pad region (c). That is, the buried layer 145 may extend to a top surface of the conductive pad 154 foamed on the second side (2) of the semiconductor layer 105.

Hereinafter, other embodiments of the inventive concept are described with reference to FIGS. 13 through 15. In the embodiments illustrated in FIGS. 13 through 15, like numbers illustrated in FIG. 8 refer to like elements throughout and the description thereof will be omitted.

Figure 13:
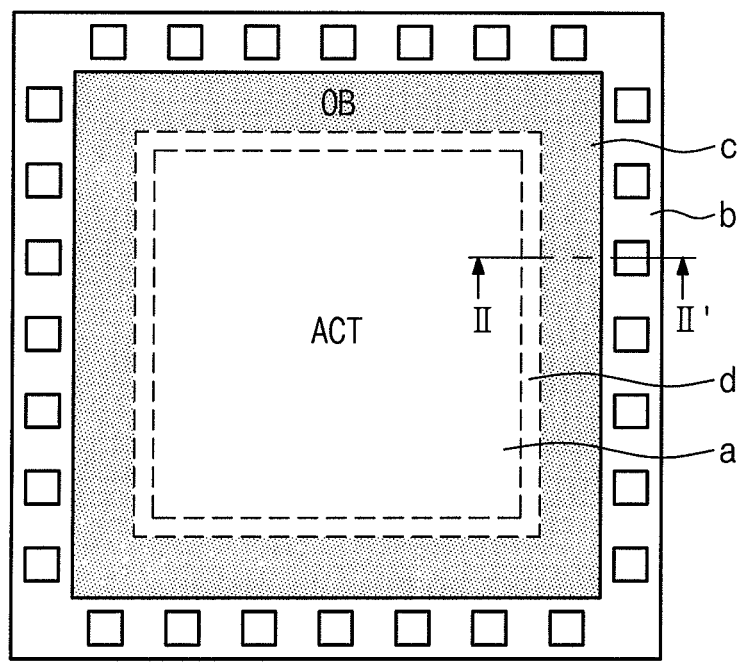
FIG. 13 is a top plan view of an image sensor in accordance with an exemplary embodiment of the inventive concept.

FIG. 13 is a top plan view of an image sensor in accordance with another embodiment of the inventive concept. FIGS. 14 and 15 are cross-sectional views of an image sensor taken along the line II-II' of FIG. 4 in accordance with another embodiment of the inventive concept.

Figure 14:
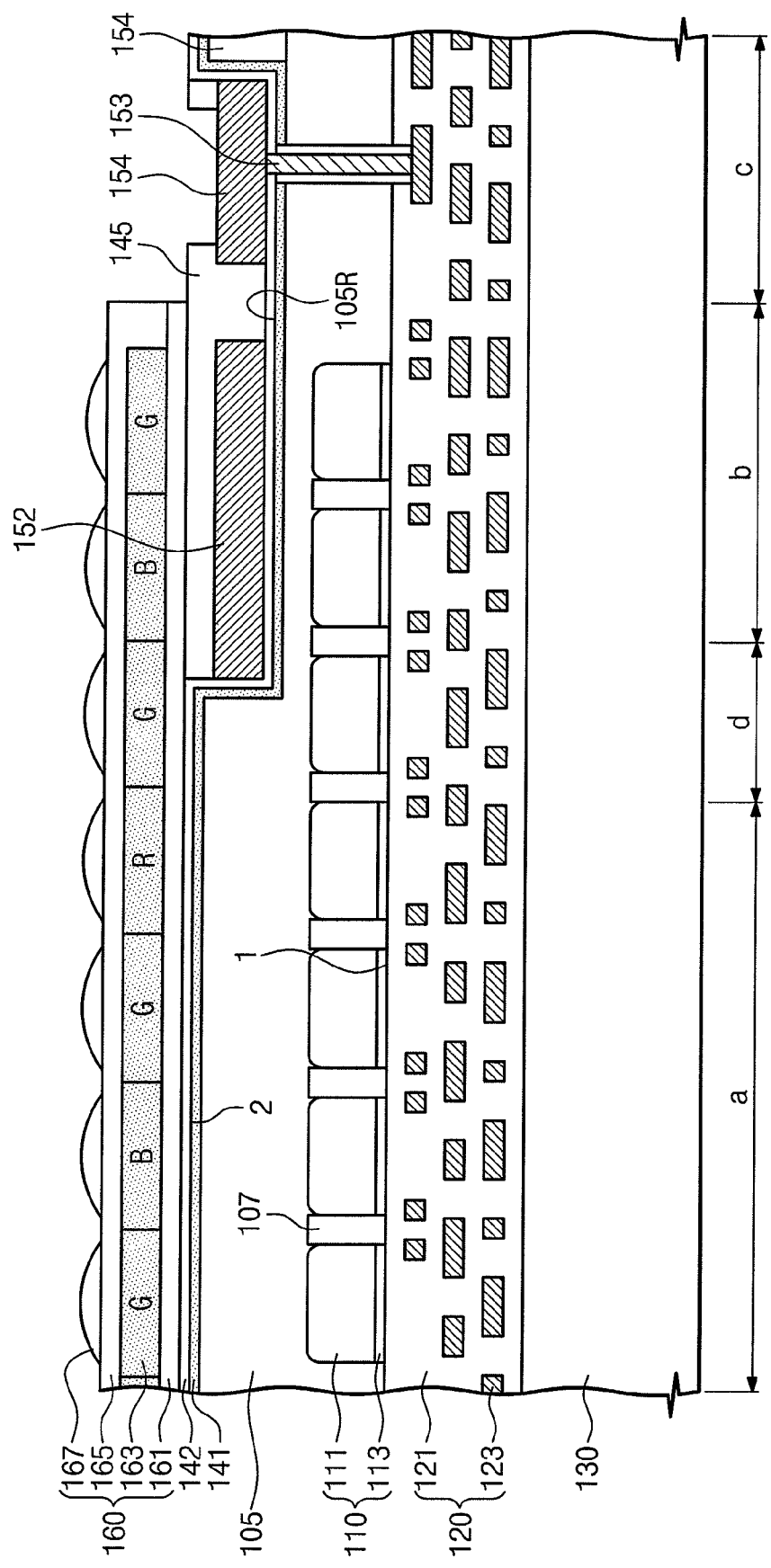
FIGS. 14 and 15 are cross-sectional views of an image sensor taken along the line II-II' of FIG. 4 in accordance with an exemplary embodiment of the inventive concept.
Figure 15:
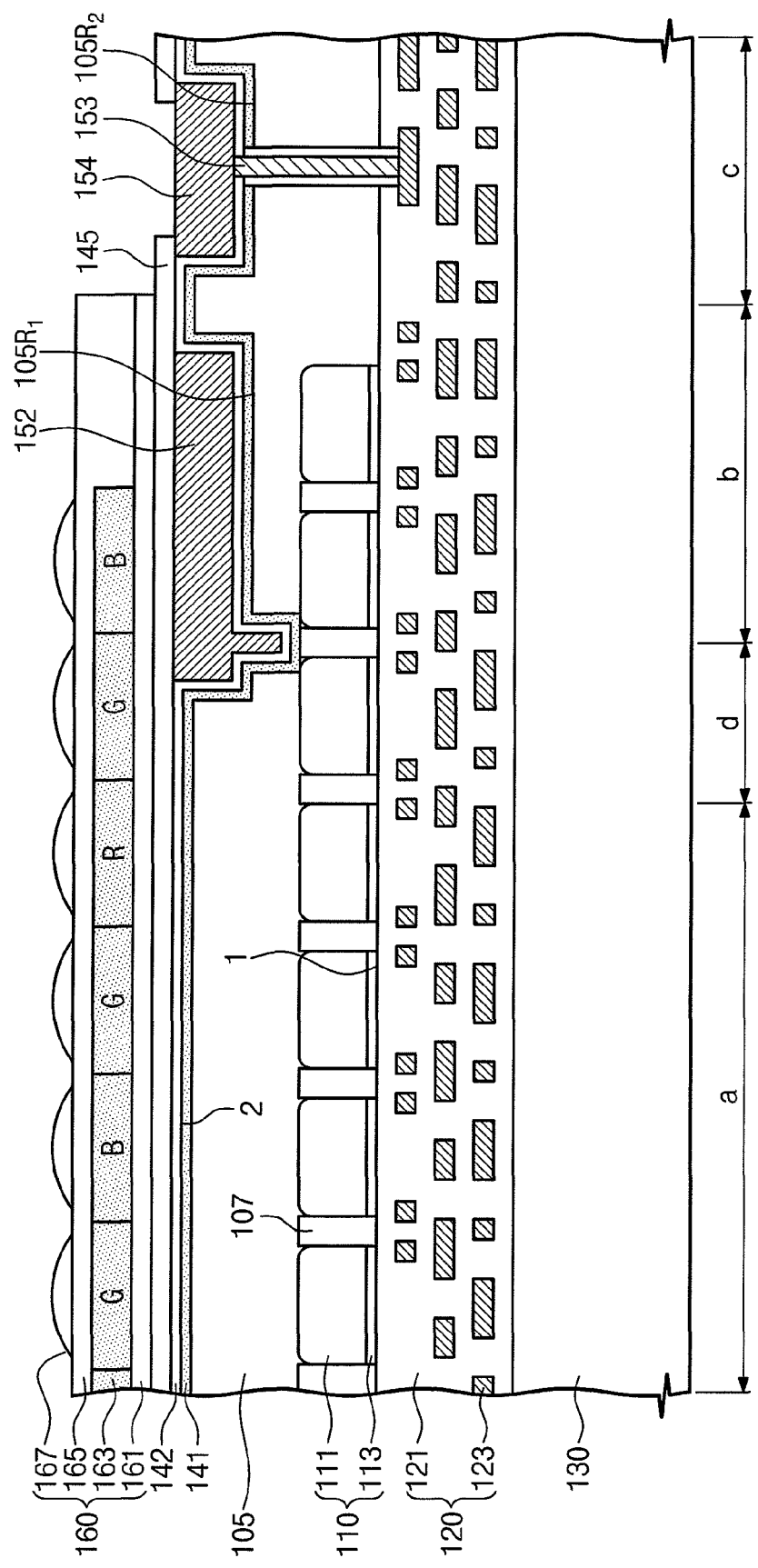

Referring to FIGS. 13 through 15, an image sensor includes an APS array region and a pad region (c). As described with reference to FIG. 2, in the APS array region, a plurality of unit pixels arranged in a matrix shape is disposed and an electric signal generated by an incident light is outputted.

In the embodiments, the APS array region includes a light receiving region (a), a light shielding region (b) and a dummy region (d) between the light receiving region (a) and the light shielding region (b). An electric signal generated by an incident light is outputted from unit pixels (e.g, active pixel sensors) arranged in the light receiving region (a). A noise signal (e.g., a reference signal) besides an electric signal generated by a light is outputted from unit pixels (e.g, reference pixel sensors) arranged in the light shielding region (b). Unit pixels of the dummy region (d) have the same structure as the unit pixels of the light receiving region (a) and the light shielding region (c) but do not output an electric signal.

Referring to FIGS. 14 and 15, as described with reference to FIG. 8, the image sensor includes the interconnection layer 120, the light penetration layer 160 and the semiconductor layer 105 between the interconnection layer 120 and the light penetration layer 160. The semiconductor layer 105 has the first side (1) adjacent to the interconnection layer 120 and the second side (2) adjacent to the light penetration layer 160.

Referring to FIG. 14, the recess region 105R formed on the second side (2) of the semiconductor layer 105 may extend to the dummy region (d) disposed between the light receiving region (a) and the light shielding region (b). The recess region 105R may also extend from the light shielding region (b) to the dummy region (d) and the pad region (c). That is, the recess region 105R may be formed over the dummy region (d), the light shielding region (b) and the pad region (c). Accordingly, one sidewall of the recess region 105R may be disposed on the dummy region (d) and the other sidewall of the recess region 105R may be disposed on the pad region (c).

Also, as illustrated in FIG. 15, the second side (2) of the semiconductor layer 105 may have a first recess region $105R_1$ formed on the light shielding region (b) and the dummy region (d) and a second recess region $105R_2$ that is formed on the pad region (c) and separated from the first recess region $105R_1$.

According to an embodiment illustrated in FIG. 15, the light shielding pattern 152 formed in the first recess region 105R1 may have a first portion adjacent to the light receiving region (a) and a second portion separated from the light receiving region (a). The first portion may be thicker than the second portion. For example, as illustrated in the drawing, the light shielding pattern 152 may include a horizontal portion crossing the dummy region (d) and the light shielding region (b) and a vertical portion vertically extending from the horizontal portion to the photoelectrical transformation elements 110. The vertical portion may be disposed on the dummy region (d) and may cut off an incident light slantingly entering the light shielding region (b) from the light receiving region (a). According to another embodiment, the light shielding pattern 152 may have an inclined lower surface connecting the first portion and the second portion. That is, the thickness of the light shielding pattern 152 may gradually increase as being adjacent to the light receiving region (a).

Figure 16:
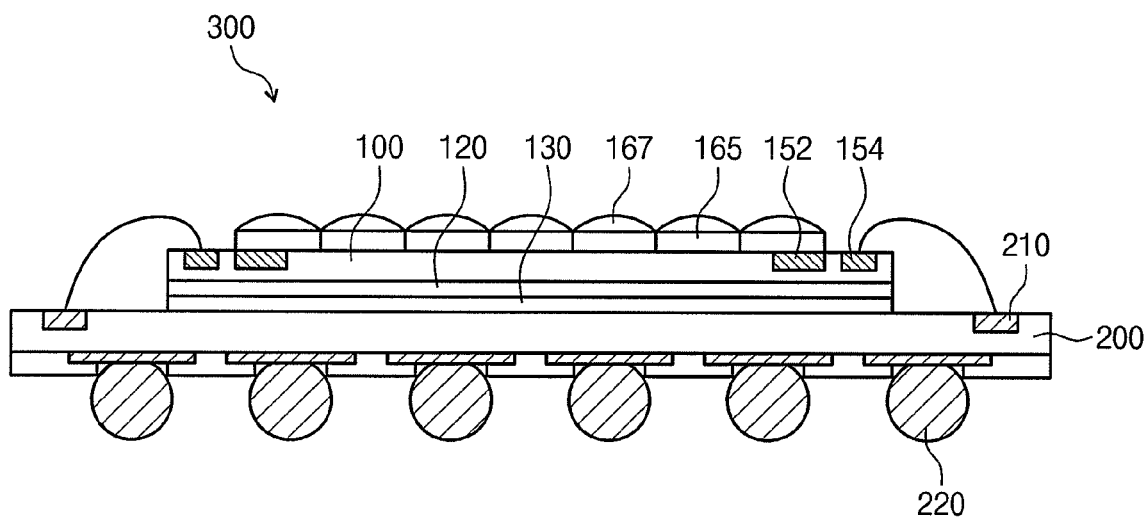
FIG. 16 is a cross-sectional view illustrating a package including an image sensor in accordance with an exemplary embodiment of the inventive concept.

FIG. 16 is a cross-sectional view illustrating a package including an image sensor in accordance with embodiments of the inventive concept.

Referring to FIG. 16, an image sensor package 300 includes an interconnection substrate 200 in which circuit interconnections are formed and an image sensor adhering onto the interconnection substrate 200. A conductive pad 154 of the image sensor may be wire-bonded to electrically connect the interconnection substrate 200 and the image sensor.

For example, as described with reference to embodiments, the image sensor includes an interconnection layer 120, a light penetration layer 160, a semiconductor layer 105 and a light shielding pattern 152. According to the embodiments, the image sensor may have a structure in which the interconnection layer 120, the semiconductor layer 105 and the light penetration layer 160 is sequentially stacked. A support substrate 130 may adhere between the interconnection substrate 200 and the interconnection layer 120 of the image sensor. Also, according to the embodiments, the light shielding pattern 152 may be disposed between photoelectrical transformation elements 110 of a light shielding region (b) and the light penetration layer 160 and may be formed in a recess region 105R formed on a second side (2) of the semiconductor layer 105. Also, a conductive pad 154 may be formed in the recess region 105R.

The interconnection substrate 200 may be, for example, a printed circuit board (PCB) and a plurality of solder balls 220 may adhere to a lower surface of the interconnection substrate 200. Connection pads 210 electrically connected to the solder balls 220 may be formed on a top surface of the interconnection substrate 200. The connection pads 210 of the interconnection substrate 200 may electrically connected to the conductive pad 154 of the image sensor through wires. Thus, an electric signal generated from the image sensor by an incident light may be transferred to the interconnection substrate 200 through the wire and may be transferred to external devices through the solder balls 220.

Although not illustrated in the drawing, on an upper portion of the image sensor, the image sensor package 300 may include a transparent plane through which a light passes while protecting the image sensor.

Figure 17:
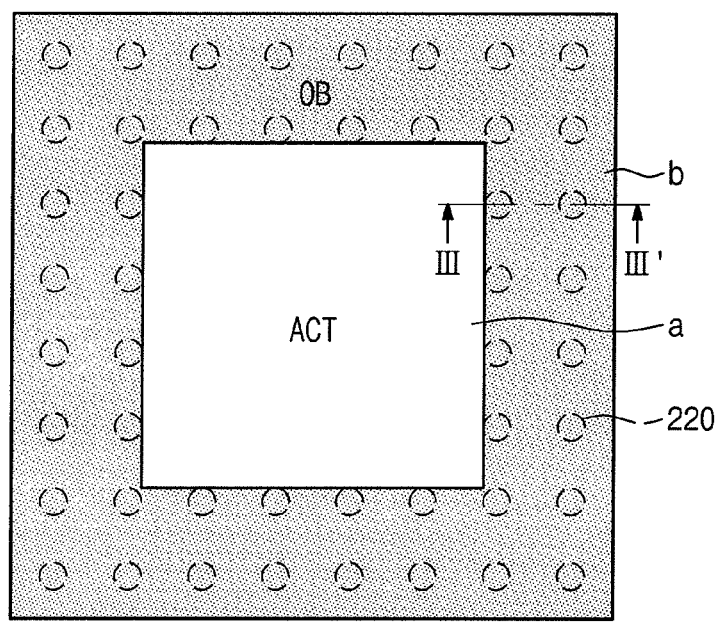
FIG. 17 is a top plan view illustrating another package including an image sensor in accordance with an exemplary embodiment of the inventive concept.
Figure 18:
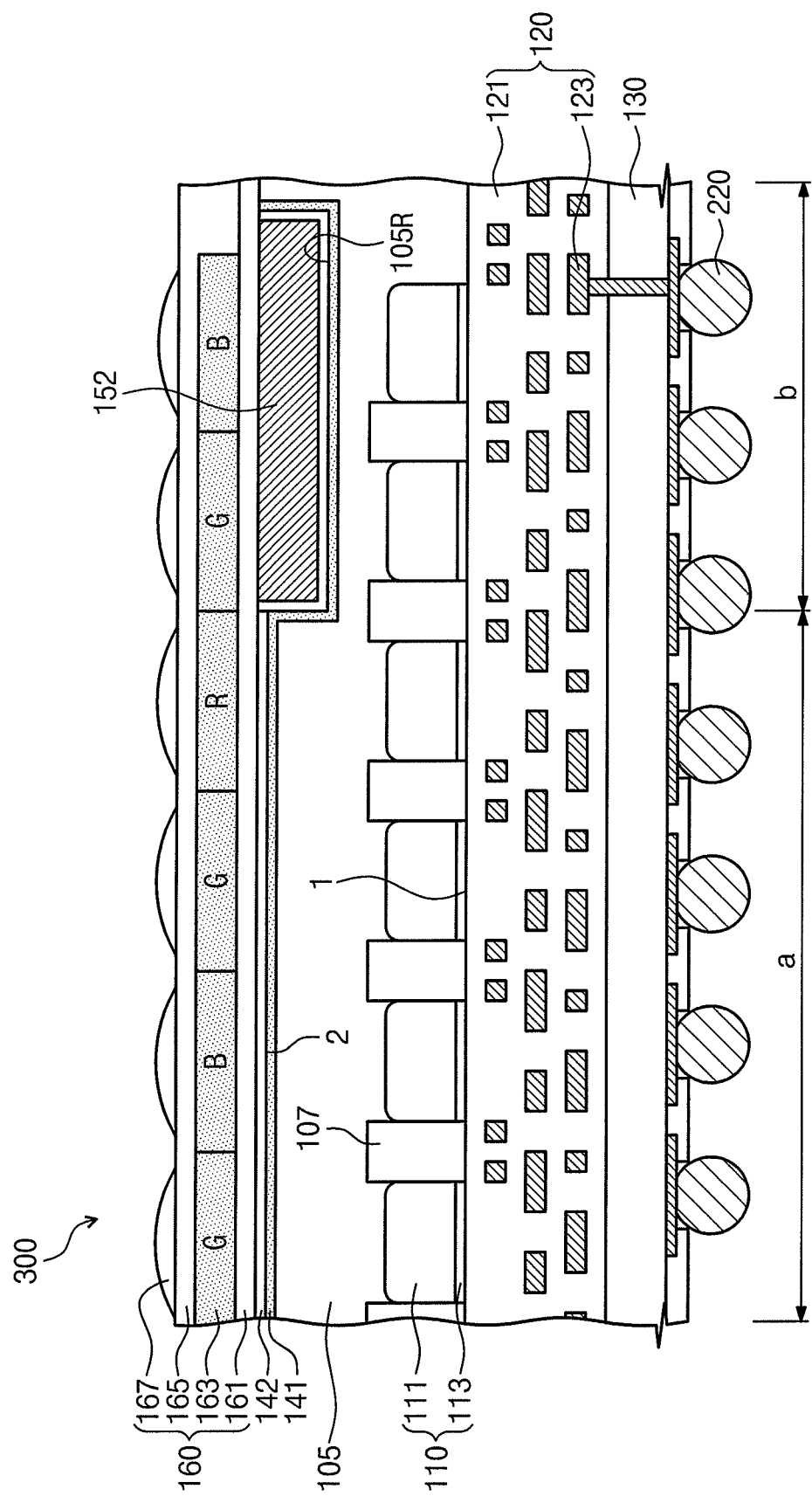
FIG. 18 is a cross-sectional view taken along the line III-III' of FIG. 17.

FIG. 17 is a top plan view illustrating another package including an image sensor in accordance with embodiments of the inventive concept. FIG. 18 is a cross-sectional view taken along the line III-III' of FIG. 17.

Referring to FIGS. 17 and 18, an image sensor having a structure in which a support substrate 130, an interconnection layer 120, a semiconductor layer 105 including light receiving region (a) and light shielding region (b) and a light penetration layer 160 is sequentially stacked may be integrated in an image sensor package 300. In the embodiments, a plurality of solder balls 220 electrically connecting the image sensor to external devices may directly adhere to the support substrate 130 of the image sensor. The solder balls 220 may be directly connected to metal interconnections 123 in the interconnection layer 120 through via contact plug penetrating the support substrate 130. Circuit interconnections may be formed on a bottom surface of the support substrate 130.

In the case that the solder ball 220 is directly connected to the support substrate 130 of the image sensor, the image sensor may not include a separate pad region (c). Thus, the size of the image sensor may be reduced. Unlike this, since pixels may be further formed at the position where the conductive pads 154 are formed before, an image sensor having a high resolution can be realized.

Hereinafter, a method of manufacturing an image sensor in accordance with embodiments of the inventive concept is described with reference to FIGS. 19 through 25. FIGS. 19 through 25 are cross-sectional views illustrating a method of manufacturing an image sensor in accordance with embodiments of the inventive concept.

Figure 19:
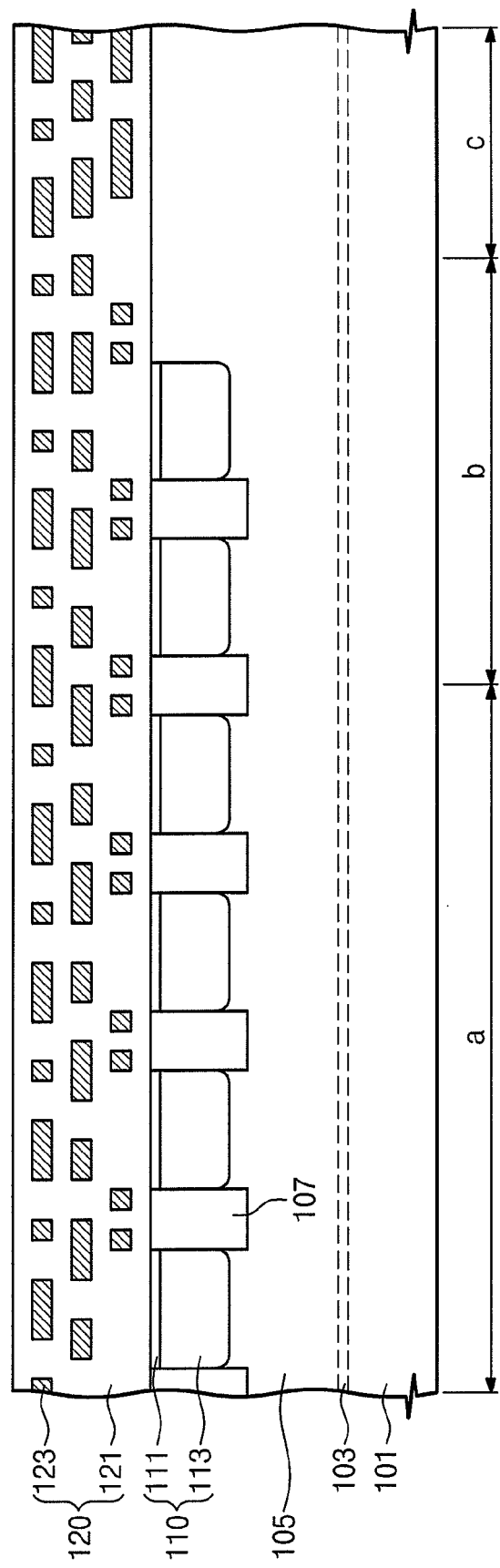
FIGS. 19 through 25 are cross-sectional views for explaining a method of manufacturing an image sensor in accordance with an exemplary embodiment of the inventive concept.

Referring to FIG. 19, a semiconductor substrate including an APS array region and a pad region (c) formed around the APS array region is prepared. The APS array region, as described with reference to FIGS. 4 and 5, includes a light receiving region (a) and a light shielding region (b) and the light shielding region (b) may be disposed between the light receiving region (a) and the pad region (c).

According to an embodiment, the semiconductor substrate may be a structure that a p-type epitaxial layer 105 is formed on a p-type bulk substrate 101. In the embodiments of the inventive concept, a surface of the p-type epitaxial layer 105 is defined as a front side and a surface of the p-type bulk substrate 101 is defined as a back side. A p-type deep well 103 may be formed in the p-type epitaxial layer 105 by, for example, implanting a p-type impurity. The p-type deep well 103 is separated from a surface of the epitaxial layer 105 to be adjacent to the bulk substrate 101.

In an embodiment of the inventive concept, the semiconductor substrate is a structure that the p-type epitaxial layer 105 is formed on the p-type bulk substrate 101 but the inventive concept is not limited thereto. For example, an n-type bulk substrate may be used instead of the p-type bulk substrate 101. Also, the semiconductor substrate may have a structure in which a p-type well is formed in the bulk substrate 101 instead of the p-type epitaxial layer 105. The semiconductor substrate may be, for example, a silicon-on-insulator (SOI) substrate that the p-type epitaxial layer 105 is formed on. That is, the semiconductor substrate may have various types of structures.

Photoelectrical transformation elements 110 are formed in the semiconductor substrate of the light receiving region (a) and the light shielding region (b). According to an embodiment, pinned photodiodes may be formed in the semiconductor substrate as photoelectrical transformation elements 110.

The pinned photodiodes include an n-type impurity region 111 and a slightly doped p-type impurity region 113 on the n-type impurity region 111. For example, the pinned photodiodes may be foamed in the semiconductor substrate of the light receiving region (a) and the light shielding region (b) and may be two dimensionally arranged in a row direction in a column direction. That is, the pinned photodiodes are spaced a predetermined distance apart from one another to be uniformly arranged. Before forming the pinned photodiodes, a device isolation layer 107 defining an active region may be formed in the p-type epitaxial layer 105 and the pinned photodiodes may be separated from one another by the device isolation layer 107.

For example, a first mask pattern (not shown) exposing a region on which the pinned photodiodes will be formed is formed on the front side of the semiconductor substrate. The n-type impurity region 111 may be formed by, for example, implanting an n-type impurity into the p-type epitaxial layer 105 using the first mask pattern. A thin p-type impurity region 113 is formed on the n-type impurity region 111 to prevent a dark current from being generated from a surface of the semiconductor substrate. After forming the pinned photodiode 110, the first mask pattern used to form the pinned photodiode 110 is removed.

After that, a floating diffusion region and source/drain regions of MOS transistors may be formed by, for example, implanting an n-type impurity into the p-type epitaxial layer 105 spaced apart from the pinned photodiode 110.

Subsequently, an interconnection layer 120 is formed on front side of the semiconductor substrate in which the photoelectrical transformation elements 110 are formed.

Forming the interconnection layer 120 includes forming control devices transferring and reading out an electric signal created from the photoelectrical transformation elements 110 and interconnections connected to the control devices and forming a plurality of interlayer insulating layer 121.

For example, the control devices transferring and reading out an electric signal may be formed on the front side of the semiconductor substrate before forming the n-type and p-type impurity regions 111 and 113 in the semiconductor substrate. That is, gate electrodes of CMOS transistors may be formed on a surface of the p-type epitaxial layer 105. For example, gates of a charge transfer device (TG), a reset device (RG), a drive device (DG) and a select device (SG) may be formed in the light receiving region (a) and the light shielding region (b). Gate electrodes of logic devices may be formed in the pad region (c). Before forming the gate electrodes, device isolation layers 107 defining active regions may be formed in the p-type epitaxial layer 105. An interlayer insulating layer 121 covering the front side of the semiconductor substrate in which the control devices are formed and metal interconnections 123 connecting the control devices are formed on the interlayer insulating layer 121. The interlayer insulating layer 121 and the metal interconnections 123 may be repeatedly stacked on the semiconductor substrate. In embodiments of the inventive concept, the metal interconnections 123 may be arranged regardless of an arrangement of the photoelectrical transformation elements 110. That is, the metal interconnections 123 may pass over the photoelectrical transformation elements 110. An arrangement of the metal interconnections 123 for an electrical routing of each device of the APS array region may be variously changed.

The interlayer insulating layer 121 is formed of a material having a beneficial gap-fill characteristic and a top surface of the interlayer insulating layer 121 is planarized. For example, high density plasma (HDP), tonen silazene (TOSZ), spin on glass (SOG), undoped silica glass (USG), etc. may be used as the interlayer insulating layer 121. The metal interconnections 123 may be formed by depositing and patterning metal material on the interlayer insulating layer 121. The metal interconnections 123 may be formed of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (TiN) and an alloy composed of combinations thereof. The metal interconnections 123 may be connected to the control devices or the metal interconnections 123 having different heights from the front side of the semiconductor substrate through contact plugs.

Figure 20:
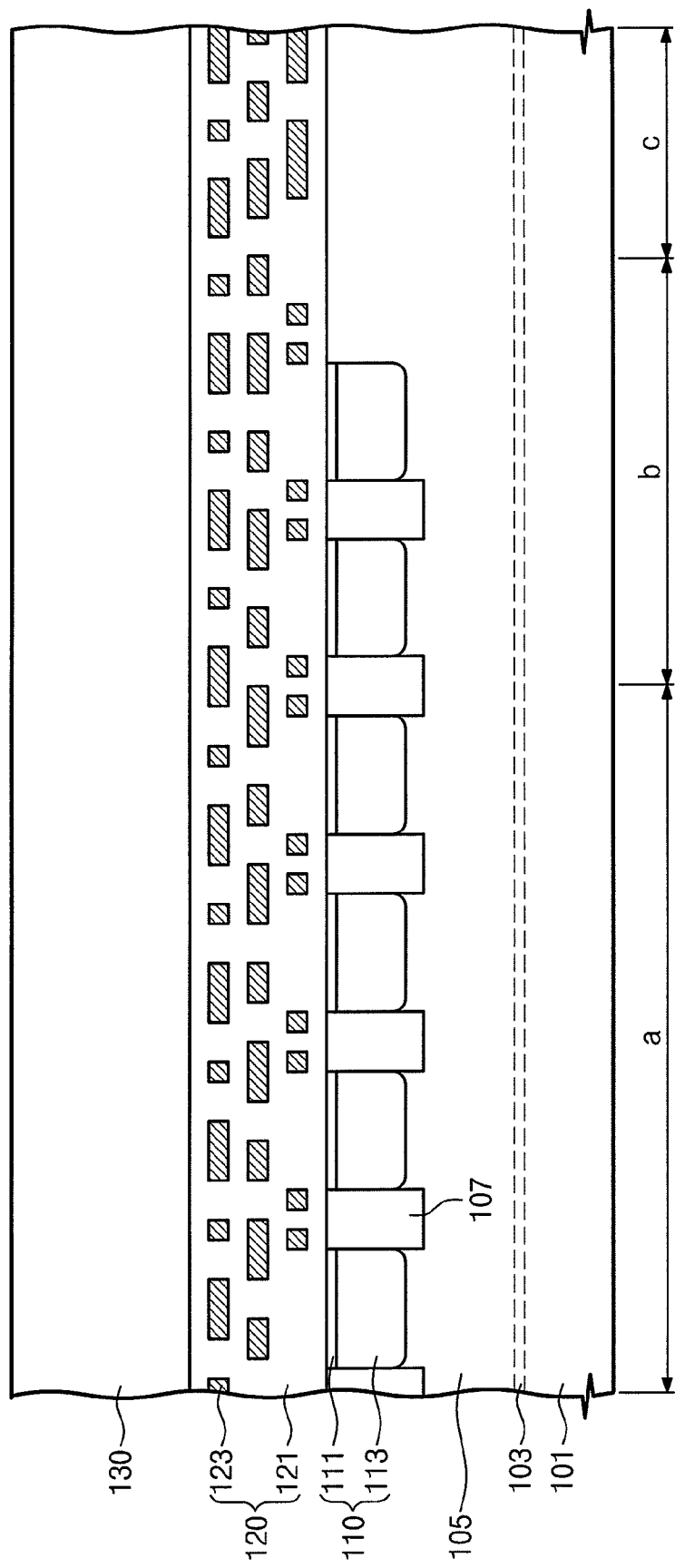

Referring to FIG. 20, a support substrate 130 adheres onto the interconnection layer 120 including the interlayer insulating layers 121 and the metal interconnections 123.

For example, the support substrate 130 may adhere onto the uppermost interlayer insulating layer 121 having a flat surface. The support substrate 130 supports the semiconductor substrate when a subsequent process making the semiconductor substrate thin is performed and prevents structures of devices formed in the semiconductor substrate from being changed. A bulk substrate (e.g, wafer) or a plastic substrate may be used as the support substrate 130.

Figure 21:
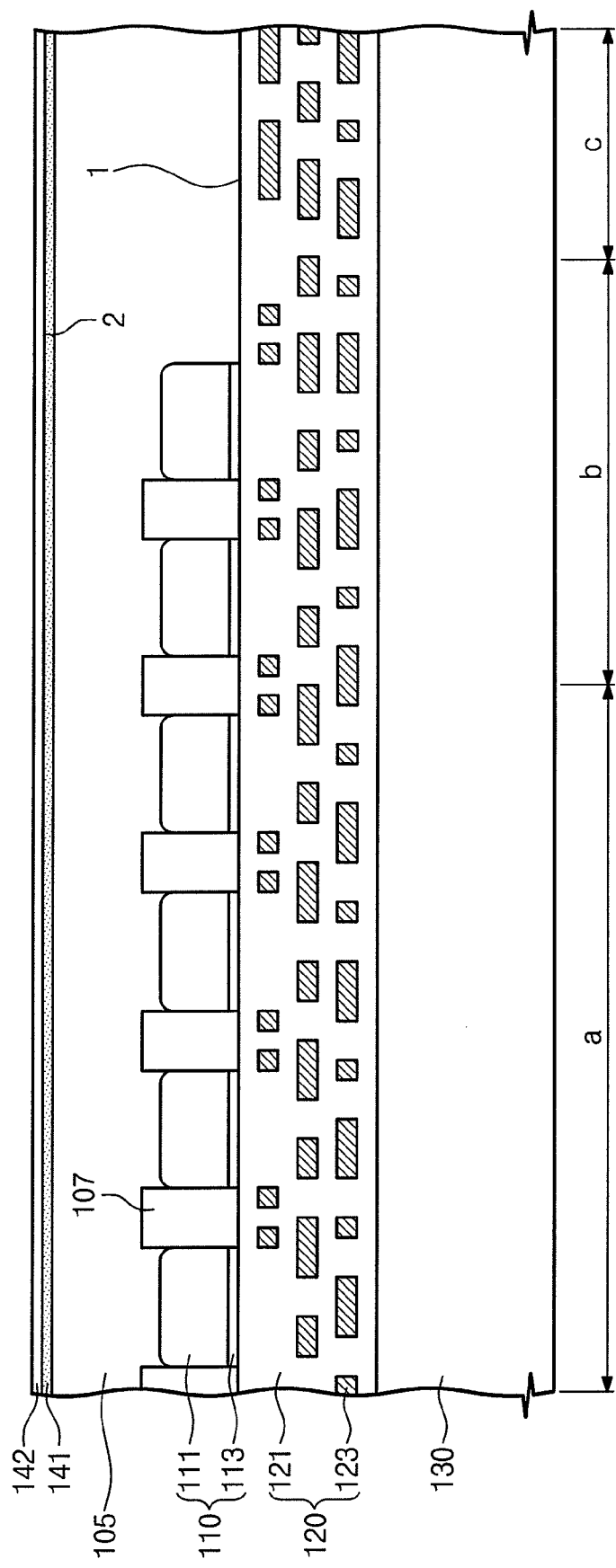

Referring to FIG. 21, the semiconductor substrate in which the photoelectrical transformation elements 110 are formed is made thin. In the case that the semiconductor substrate is thick in the image sensor such that a light enters from a back side of the semiconductor substrate, the light entering the photoelectrical transformation elements 110 may be lost. However, the distance of an incident light may be reduced by making the semiconductor substrate thin. Also, a light entering the image sensor from the outside has a penetration depth into the semiconductor layer 105 that may become different according to the wavelength range. Therefore, the thickness of the semiconductor layer 105 may be determined by the wavelength range of a light entering the image sensor when making the semiconductor substrate thin.

For example, making the semiconductor substrate thin includes grinding or polishing the bulk substrate, and performing an isotropic etching and anisotropic etching on the bulk substrate. According to an embodiment, a top and a bottom of the semiconductor substrate may be reversed to make the bulk substrate thin. That is, as illustrated in the drawing, the n-type impurity region 111 may be disposed over the interconnection layer 120.

A portion of the semiconductor substrate is mechanically removed using, for example, a grinder or a chemical mechanical polishing (CMP) device. The p-type bulk substrate 101 may be removed by, for example, a mechanical thin film process. After removing a portion of the semiconductor substrate, a remaining thickness of the semiconductor substrate may be minutely controlled by, for example, performing an isotropic etching or an anisotropic etching. For example, a wet etching may be performed on the semiconductor substrate using compound solution of hydrofluoric acid (HF), nitric acid (HNO3) and acetic acid ($CH_5COOH$). In the case that the p-type deep well 103 is formed in the p-type epitaxial layer, the p-type deep well 103 may be used as an etching stop layer when a thin film process is performed.

The p-type bulk substrate 101 and the high concentration p-type deep well 103 are removed from the semiconductor substrate comprised of the p-type bulk substrate 101, the high concentration p-type deep well 103 and the p-type epitaxial layer 105 by the thin film process and thereby the p-type epitaxial layer 105 may substantially remain. In an embodiment, a remaining thickness of the p-type epitaxial layer 105 may be, for example, about 1 to about 10 μm. Alternatively, a portion of the p-type deep well 103 may remain together with the p-type epitaxial layer 105. Also, in an embodiment, it was described that as a thickness of the semiconductor substrate is reduced, the p-type epitaxial layer 105 remains. However, the p-type epitaxial layer may be a substrate composed of, for example, a semiconductor material.

The remaining p-type epitaxial layer 105 may have a first side (1) adjacent to the interconnection layer 120 and a second side (2) that faces the first side (1) and exposed by the thin film process. In an embodiment, the second side (2) of the p-type epitaxial layer 105 may be spaced apart from the n-type impurity region 111 of the pinned photodiode.

Since a path of a light entering the photoelectrical transformation elements 110 of the light receiving region (a) can be reduced by removing a portion of the semiconductor substrate to reduce a thickness of the semiconductor substrate, the light sensitivity of the photoelectrical transformation elements 110 may thereby be increased.

When making the semiconductor substrate thin using a grinding and an etching process, a defect due to a mechanical attack and a chemical attack may occur on a surface of the semiconductor substrate. That is, minute defects may exist on the second side (2) of the p-type epitaxial layer 105 exposed by a grinding and an etching process. For example, surface defects such as dangle bonds or broken bonds may exist on the second side (2) of the p-type epitaxial layer 105. When a light enters the photoelectrical transformation elements 110, a surface defect of the p-type epitaxial layer 105 generates electron carriers or hole carriers and provides a recombination place for an electron and a hole, thereby increasing a leakage current. That is, a dark current that an electron moves in a lightless state is generated. Thus, a low illumination characteristic of the CMOS image sensor may be weakened.

After thinning the semiconductor substrate, a process removing a surface defect of the semiconductor substrate (e.g, the p-type epitaxial layer 105) is performed. A chemical method may be used to remove a surface defect of the semiconductor substrate. When using a chemical method, a buffer insulating layer 142 may be formed on the second side (2) of the p-type epitaxial layer 105 simultaneously with removing surface defects of the semiconductor substrate. Also, silicon of the p-type epitaxial layer 105 may be consumed during a removal of surface defects of the semiconductor substrate and thereby a thickness of the p-type epitaxial layer 105 may be reduced. The buffer insulating layer 142 may be a thin layer having a thickness, for example, of about 1 nm to about 10 nm.

According to an embodiment, the buffer insulating layer 142 may be, for example, a thermal oxide layer fanned by performing a thermal oxidation process and a dry oxidation method using $O_2$ or a wet oxidation method using $H_2O$ may be used as the thermal oxidation process. The buffer insulating layer 142 may be, for example, a CVD oxidation layer formed by performing a CVD process. According to another embodiment, the buffer insulating layer 142 may be, for example, a chemical oxide layer formed by using a chemical solution. The chemical oxide layer may be formed by using, for example, a chemical solution consuming silicon at a low temperature so that surface defects of the p-type epitaxial layer 105 can be removed without affecting the interconnection layer 120 formed on the second side (2) of the p-type epitaxial layer 105. For example, a mixture (SC-1 solution) of ammonium hydroxide ($NH_4OH$), hydrogen peroxide ($H_2O_2$) and water ($H_2O$), a mixture (SC-2 solution) of hydrochloric acid (HCl), hydrogen peroxide ($H_2O_2$) and water ($H_2O$) or a solution (an ozone water) that ozone ($O_3$) is dissolved in a deionized water may be used as the chemical solution.

Also, after making the semiconductor substrate thin, a high concentration p-type impurity layer 141 may be formed on the second side (2) of the p-type epitaxial layer 105.

According to an embodiment, the high concentration p-type impurity layer 141 may be formed by, for example, forming a material layer including a p-type impurity directly contact the second side (2) of the p-type epitaxial layer 105 and diffusing the p-type impurity into the p-type epitaxial layer 105. For example, an insulating layer including the p-type impurity is formed on the second side (2) of the p-type epitaxial layer 105. For example, a boron (B) ion may be used as the p-type impurity and borosilicate glass (BSG) layer may be formed as an insulating layer including the p-type impurity. After forming the insulating layer including the p-type impurity, the p-type impurity is diffused into the p-type epitaxial layer 105 by performing, for example, a thermal annealing process or a laser annealing process. As a result, the high concentration p-type impurity layer 141 may be formed on the second side (2) of the p-type epitaxial layer 105. The high concentration p-type impurity layer 141 formed by the methods described above can reduce a dark current generated by a surface defect of the p-type epitaxial layer 105.

Figure 22:
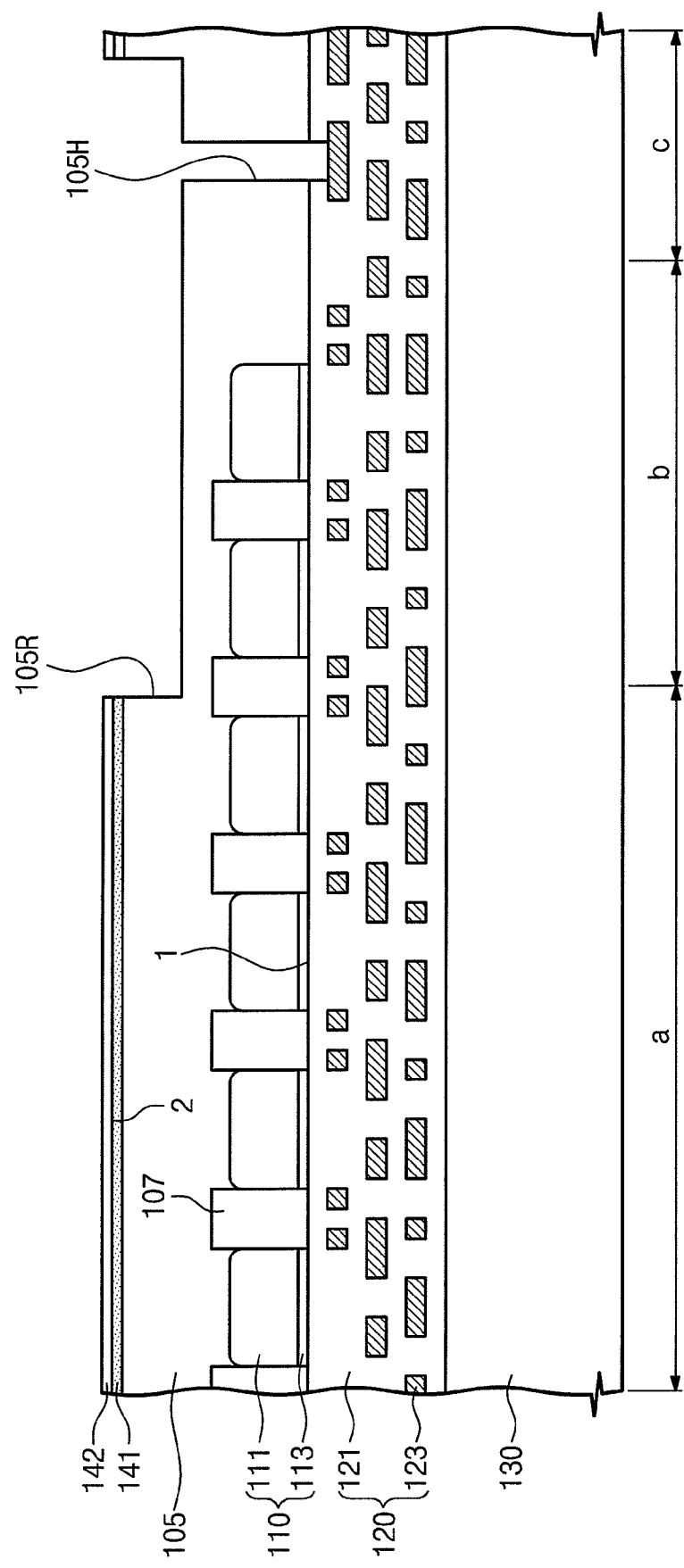

Referring to FIG. 22, a recess region 105R recessed from the second side (2) of the p-type epitaxial layer 105 is formed.

For example, fuming the recess region 105R may include forming a mask pattern (not illustrated) defining a flat location of the recess region 105R on the p-type epitaxial layer 105 and performing an anisotropic etching process on the second side (2) of the p-type epitaxial layer 105 using the mask pattern as an etching mask.

The recess region 105R may be formed on an upper portion of the photoelectrical transformation elements 110 of the light shielding region (b). The thickness of the p-type epitaxial layer 105 on the light receiving region (a) may be greater than that of the p-type epitaxial layer 105 on the light shielding region (b). The recess depth of the recess region 105R may be different according to a thickness of a light shielding pattern 152 to be subsequently formed and may be, for example about 500 Å to about 2000 Å. The recess region 105R may be spaced apart from the n-type impurity region 111 in the p-type epitaxial layer 105. The n-type impurity region 111 on the light shielding region (b) may be exposed by the recess region 105R. In the case that a thickness of the device isolation layer 107 formed in the semiconductor layer 105 is greater than a thickness of the n-type impurity region 111, the device isolation layer 107 may be used as an etching stop layer when forming the recess region 105R.

Also, the recess region 105R, as illustrated in FIG. 22, may be formed by a structure that extends from the light shielding region (b) to the pad region (c). According to another embodiment, the recess region 105R, as illustrated in FIG. 12, may be locally formed in the light shielding region (b). According to still another embodiment, the recess region 105R, as illustrated in FIG. 11, may be formed in the light shielding region (b) and the pad region (c) respectively. That is, the first recess region $105R_1$ formed on the light shielding region (b) and the second recess region $105R_2$ formed on the pad region (c) separated from the first recess region $105R_1$ may be formed on the second side (2) of the p-type epitaxial layer 105.

Before or after forming the recess region 105R, a penetration hole 105H penetrating the p-type epitaxial layer 105 to expose the interconnection layer 120 may be formed on the pad region (c). The penetration hole 105H can be connected to the recess region 105R in the pad region (c). Also, before or after forming the recess region 105R, as illustrated in FIG. 15, an opening that is perpendicular to the p-type epitaxial layer 105 may be formed on the light shielding region (b).

Figure 23:
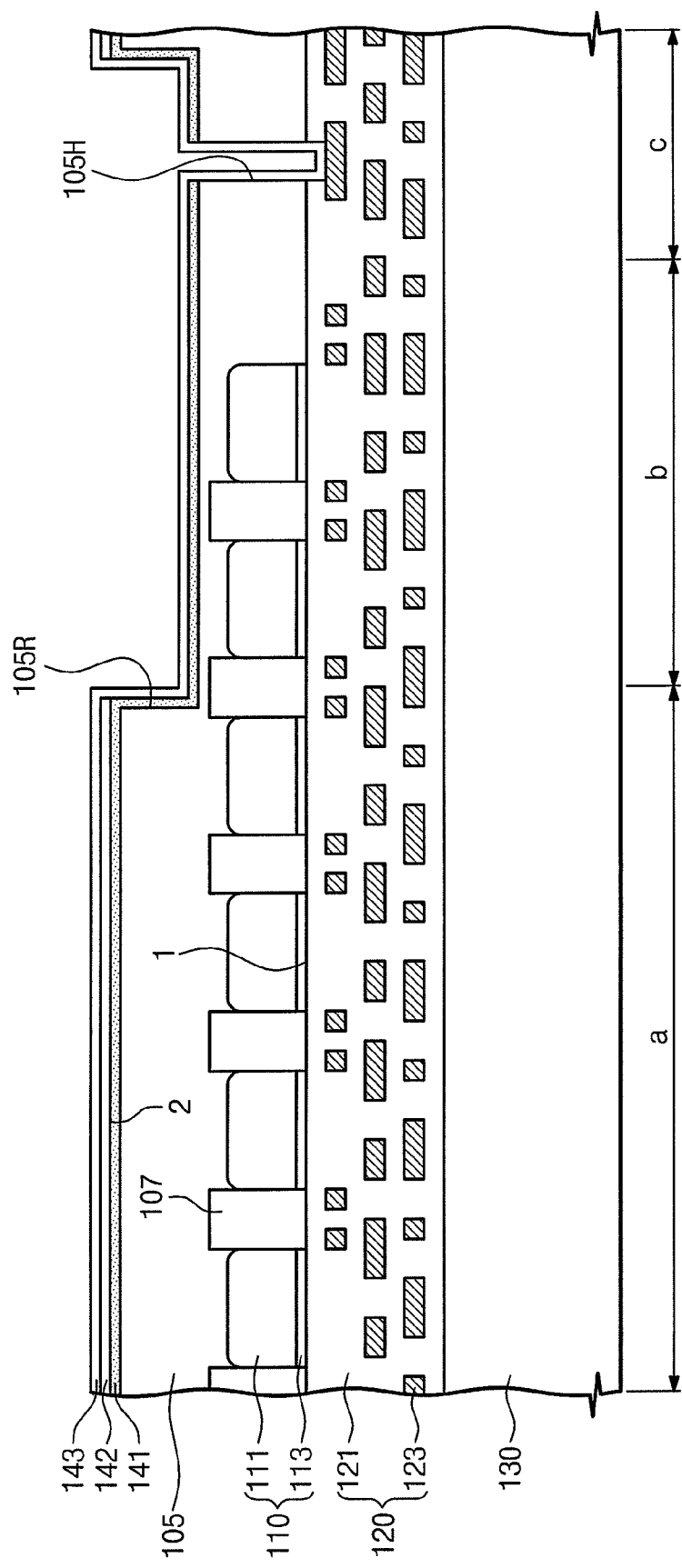

Referring to FIG. 23, after forming the recess region 105R, the buffer insulating layer 143 may be conformally formed in the recess region 105R. The buffer insulating layer 143 may be formed on an inner wall of the penetration hole 105H of the pad region (c). The buffer insulating layer 143 formed in the recess region 105R, as described with reference to FIG. 22, may be, for example, a thermal oxide layer, a CVD oxide layer or a chemical oxide layer. The buffer insulating layer 142 foamed in the recess region 105R can cure etching damage to the surface of the recess region 105R and insulates a metal layer subsequently to be formed from the p-type epitaxial layer 105.

In an embodiment, since the recess region 105R is formed after forming the buffer insulating layer 142 on the second side (2) of the p-type epitaxial layer 105, thicknesses of the buffer insulating layers 142 and 143 may be different in the light receiving region (a) and the light shielding region (b). According to another embodiment, the buffer insulating layer 142, as illustrated in FIG. 8, may be conformally formed on the second side (2) of the p-type epitaxial layer 105 after removing a portion of the semiconductor substrate to form the recess region 105R.

Also, the buffer insulating layer 143 of the recess region 105R may include a p-type impurity and in this case, after forming the buffer insulating layer 143, the p-type impurity is diffused by performing, for example, a thermal annealing process or a laser annealing process and thereby the high concentration p-type impurity layer 141 may be conformally formed on the recess region 105R.

Figure 24:
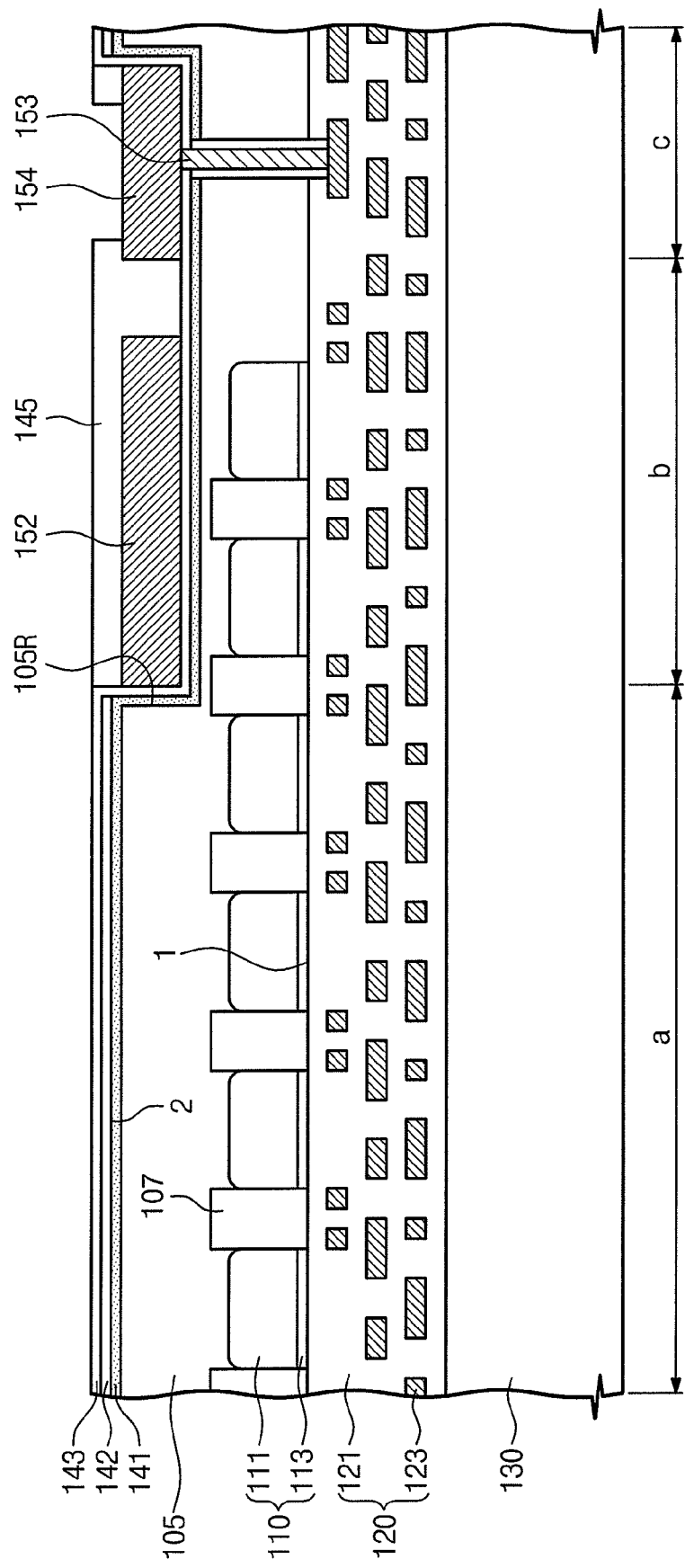

Referring to FIG. 24, a light shielding pattern 152 and a conductive pad 154 are foamed in the recess region 105R on which the buffer insulating layer 143 is formed.

For example, forming the light shielding pattern 152 and the conductive pad 154 includes that they are conformally formed on the second side (2) of the p-type epitaxial layer 105 where the recess region 105R is formed. For example, the light shielding pattern 152 and the conductive pad 154 may be formed of the same material, e.g., same metal layer or same conductive layer. For example, in an embodiment, the metal layer for forming the light shielding pattern 152 and the conductive pad 154 may include copper (Cu), aluminum (Al), tungsten (W), titanium (Ti), molybdenum (Mo), tantalum (Ta), a titanium nitride layer (TiN), a tantalum nitride layer (TaN), a zirconium nitride layer (ZrN), tungsten nitride layer (TiN) and an alloy composed of combinations thereof may be used as the metal layer. The metal layer may be formed using, for example, a deposition method (e.g., a chemical vapor deposition, an atomic layer deposition or a physical vapor deposition) which can provide a superior step difference coating characteristic.

The metal layer has a thickness that can completely shield a light. Since an ability of absorbing and cutting off a light is different according to metal material, a thickness of the metal layer may become different. For example, a deposition thickness of the metal layer may be about 500 Å to about 2000 Å. The thickness of the metal layer may be greater or smaller than a recess depth of the recess region 105R.

After forming the metal layer, the metal layer formed on the light receiving region (a) is removed by performing, for example, a patterning process or a planarization process. For example, as illustrated in FIG. 8, in the case that the recess region 105R extends from the light shielding region (b) to the pad region (c), the metal layer is patterned to form the light shielding pattern 152 and the conductive pad 154 that are separated from each other in the recess region 105R. Also, as illustrated in FIG. 11, in the case that the recess regions 105R are formed on the light shielding region (b) and the pad region (a) respectively, the light shielding region (b) and the conductive pad 154 may be formed by performing, for example, a planarization process after depositing the metal layer filling the recess regions ($105R_1$, $105R_2$). On the other hand, as illustrated in FIG. 12, in the case that the recess region 105R is locally formed on the light shielding region (b), the light shielding pattern 152 may be formed in the recess region 105R and the conductive pad 154 may be formed on the second side (2) of the p-type epitaxial layer 105 by a patterning process. As illustrated in FIG. 18, in the case that the conductive pad 154 is formed on the interconnection layer 120 in advance, only the light shielding pattern 152 is formed in the recess region 105R.

Subsequently, a buried layer 145 filling the recess region 105R in which the light shielding pattern 152 and the conductive pad 154 are formed may be formed. The buried layer 145 may be formed by, for example, depositing insulating material having a beneficial gap-fill characteristic and an upper portion of the buried layer 145 may be planarized. For example, a high density plasma (HDP) oxide layer, a TEOS oxide layer, tonen silazene (TOSZ), spin on glass (SOG), undoped silica glass (USG) or a high-k dielectric layer may be used as the buried layer 145.

The buried layer 145 can conformally cover the second side (2) of the p-type epitaxial layer 105 while filling the recess region 105R in which the light shielding pattern 152 is formed. In the case that the light pattern 152 and the conductive pad 154 are formed in the recess region 105R, the light shielding pattern 152 and the conductive pad 154 may be buried in the buried layer 145.

In the case that a thickness of the light shielding pattern 152 is smaller than a recess depth of the recess region 105R, the buried layer 145 is locally formed in the recess region 105R by, for example, a planarization process and the p-type epitaxial layer 105 of the light receiving region (a) may be exposed. In the case that a thickness of the light shielding pattern 152 is equal to or greater than a recess depth of the recess region 105R, the buried layer 145 may be formed on the light receiving region (a) while covering the light shielding pattern 152 and the conductive pad 154. An upper portion of the buried layer may be planarized. Also, the conductive pad 154 is foamed on the second side (2) of the p-type epitaxial layer 105, and the buried layer 145 may conformally cover the conductive pad 154.

After forming the buried layer 145, the buried layer 145 is patterned to form an opening exposing the conductive pad 154.

Figure 25:
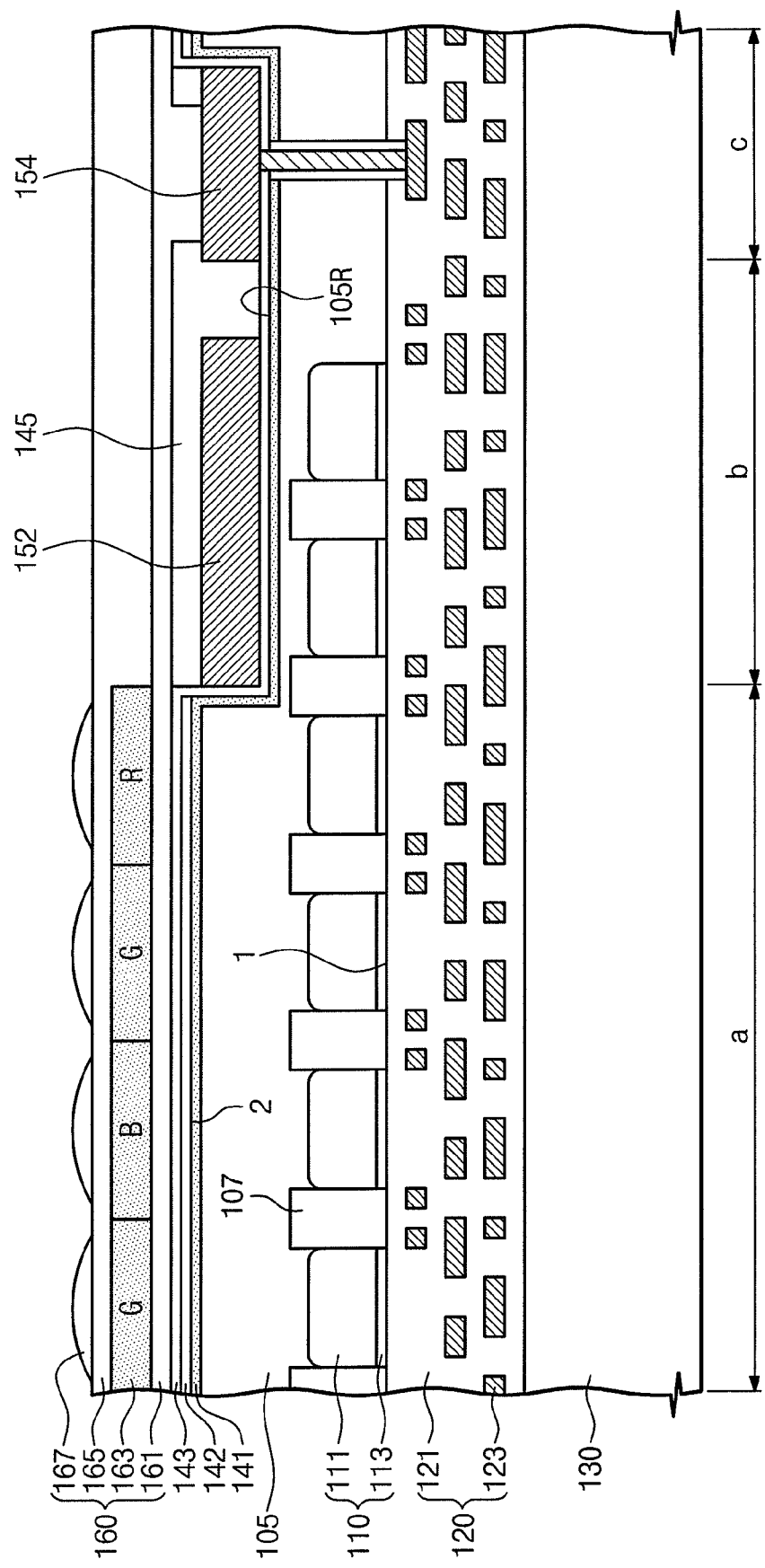

Referring to FIG. 25, after forming the light shielding pattern 152, a light penetration layer 160 is formed on the second side (2) of the p-type epitaxial layer 105. For example, the light penetration layer 160 includes a lower flat layer 161, color filters 163, an upper flat layer 165 and microlenses 167 that are sequentially formed.

The lower flat layer 161 may be formed on the second side (2) of the p-type epitaxial layer 105. That is, the lower flat layer 161 may be formed on the buffer insulating layer 143 of the light receiving region (a) and on the buried layer 145 of the light shielding region (b) and the pad region (c). Alternatively, the lower flat layer 161 may be formed on the buried layer 145 covering the light shielding region (b) and the pad region (c). The lower flat layer 161 may also fill the opening formed in the buried layer of the pad region (c).

The lower flat layer 161 may be formed of, for example, material having a refractive index greater than a silicon oxide to improve a light sensitivity. For example, the lower flat layer 161 may be formed of material having a refractive index of about 1.4 to about 4.0. The lower and upper flat layer 161 and 165 may be formed from a material such as, for example, $Al_2O_3$, $CeF_3$, ITO, MgO, $TiO_2$, $ZrO_2$, Si, ZnSe, ZnS or $PhF_2$.

The lower flat layer 161 may be formed from organic matter having a high refractive index such as, for example, siloxane resin, benzocyclobutene (BCB), polyimide system, acryl system, parylene C, methyl methacrylate (PMMA), polyethylene terephthalate (PET), etc.

Subsequently, the color filters 163 corresponding to the respective photoelectrical transformation elements 110 are formed on the lower flat layer 161. The color filters 163 may be formed on not only the light receiving region (a) but also the light shielding region (b) and the color filters 163 of the light shielding region (b) may be used a dummy pattern. The color filters 163 may be formed using, for example, a dyeing method, a pigment dispersion method, a printing method, etc. A photoresist dyed with a color corresponding to each pixel is mainly used in the color filters 163. For example, the color filter 163 may be formed by one of red, green and blue. The color filter 163 may also have a color such as, for example, cyan, magenta or yellow. The color filter 163 may be, for example, two dimensionally arranged like an arrangement of the photoelectrical transformation elements 110 and may be arranged by a bayer shape.

The microlens 167 is formed on the each of the color filters. The microlens 167 may be formed using, for example, a light penetration photoresist. For example, after forming photoresist patterns on each of the photoelectrical transformation element, the microlens 167 may be formed by performing a reflow of the photoresist patterns. As a result, the microlens 167 having, for example, a specific curvature and an upwardly convex shape may be foamed.

After that, a process removing a residue on a surface of the microlens 167 may be performed as a subsequent process. A bake process may be performed to maintain a shape of the microlens 167.

Before foaming the microlens 167, the upper flat layer 165 may be formed on the color filters 163 using material of polyimide system having a beneficial light penetration characteristic or a material of polyacrylic system having a beneficial light penetration characteristic.

After forming the light penetration layer 160 including the color filters 163 and the microlens 167 on the semiconductor layer 105, a patterning process for exposing the conductive pad 154 under the light penetration layer 160 may be performed. That is, the lower and upper flat layers 161 and 165 formed on the conductive pad 154 are locally removed.

Figure 26:
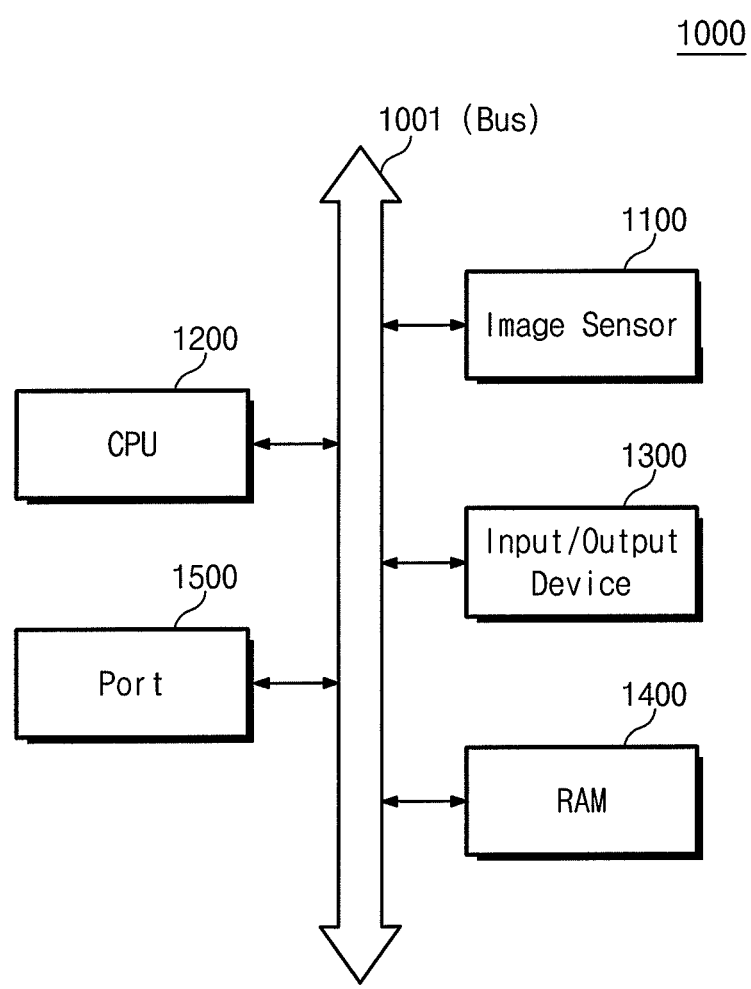
FIG. 26 is a block diagram illustrating a processor-based system including an image sensor in accordance with an exemplary embodiment of the inventive concept.

FIG. 26 is a block diagram illustrating a processor-based system including an image sensor in accordance with embodiments of the inventive concept.

Referring to FIG. 26, the process-based system 1000 is a system processing an output image of an image sensor 1100.

The system 1000 may illustrate, for example, a computer system, a camera system, scanner, a mechanic watch system, a navigation system, a video phone, a supervisory system, an autofocus system, a tracing system, an operation monitoring system, an image stability system, etc. but the system 1000 is not limited to aforementioned those systems.

The process-based system 1000 such as a computer system may include, for example, a central processing unit (CPU) 1200 such as a microprocessor that can communicate with an input/output device 1300 through a bus 1001. The image sensor 1100 can communicate with the system 1000 through the bus 1001 or other communication link. The process-base system 1000 may further include, for example, a random access memory (RAM) 1400 and/or a port 1500 that can communicate with the central processing unit (CPU) 1200 through the bus 1001.

The port 1500 may be a port that is coupled to, for example, a video card, a memory card, a USB device, etc. or that can exchange data with other systems. The image sensor 1100 may be integrated together with, for example, a CPU, a digital signal processing (DSP) device or a microprocessor. The image sensor 1100 may also be integrated together with a memory. In some cases, the image sensor 1100 may be integrated in a different chip from a processor.

Figure 27:
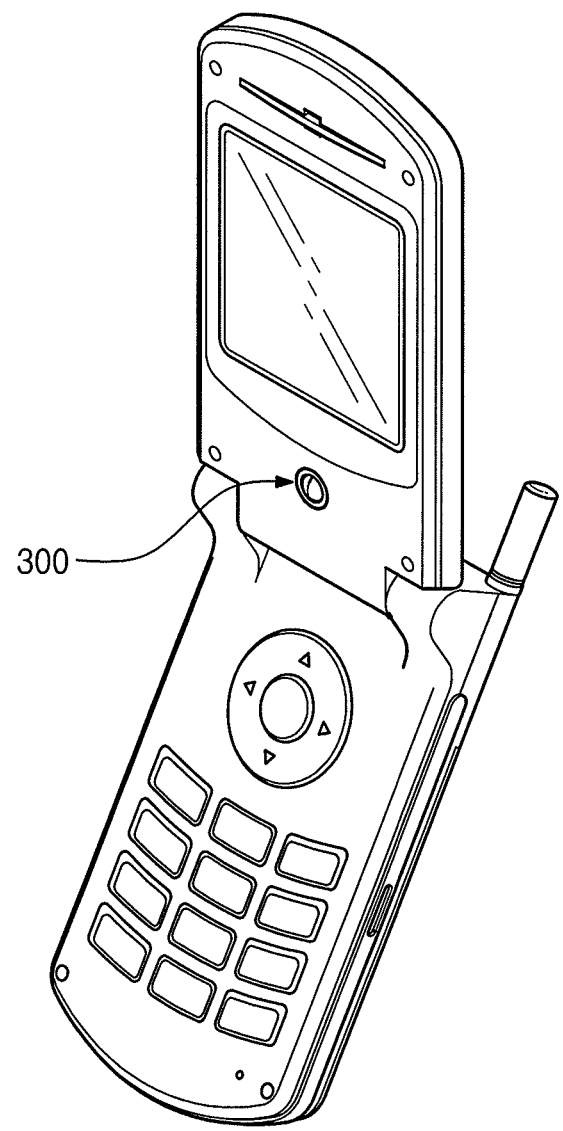
FIG. 27 is a perspective view illustrating an example of an electronic device including an image sensor in accordance with an exemplary embodiment of the inventive concept.

FIG. 27 is a perspective view illustrating an example of an electronic device including an image sensor in accordance with embodiments of the inventive concept.

Referring to FIG. 27, an image sensor 300 in accordance with embodiments of the inventive concept may be included in a mobile phone 2000. Also, the image sensor 300 may be included in an electronic device such as, for example, a camera, a camcorder, a personal digital assistant (PDA), a wireless phone, a laptop computer, an optical mouse, a facsimile and a copying machine. Also, an image sensor 300 in accordance with embodiments of the inventive concept may be included in a device such as, for example, a telescope, a mobile phone hand set, a scanner, an endoscope, a fingerprint identification device, a toy, a game machine, a home robot and a vehicle.

According to embodiments of the inventive concept, a light shielding pattern preventing a light from entering a photoelectrical transformation element is formed in a recess region of a semiconductor substrate. As a result, light penetration devices (e.g., a color filter and a microlens) may be formed on a flat semiconductor substrate. That is, microlenses are formed in an inclined surface, thereby preventing a light from entering a photoelectrical transformation element under the light shielding pattern. Thus, with an image sensor according to embodiments of the inventive concept, an electric signal outputted from reference pixel sensors may be prevented from being deteriorated and an image sensed by an image sensor may in turn be prevented from being distorted, thereby improving the accuracy of the image sensor.

While the inventive concept has been described with reference to exemplary embodiments, it is readily apparent to those skilled in the art that various changes and modifications may be made without departing from the spirit and scope of the inventive concept which is defined by the metes and bounds of the appended claims.

What is claimed is:

1. An image sensor comprising:
an interconnection layer including a plurality of interconnections which are vertically stacked;
a light penetration layer including a plurality of color filters and a plurality of microlenses;
a semiconductor layer between the interconnection layer and the light penetration layer, the semiconductor layer including a plurality of photoelectrical transformation elements;
a light shielding pattern between the light penetration layer and the semiconductor layer, wherein a surface of the semiconductor layer adjacent to the light penetration layer having a recess region recessed toward the interconnection layer and wherein the light shielding pattern is formed in the recess region and at least one of the photoelectrical transformation elements is formed in the semiconductor layer between the light shielding pattern and the interconnection layer; and
a buffer insulating layer disposed between the light shielding pattern and the semiconductor layer.

2. The image sensor of claim 1, wherein the light shielding pattern is only partially inserted into the recess region.

3. The image sensor of claim 2, wherein a thickness of the light shielding pattern is smaller than a depth of the recess region.

4. The image sensor of claim 1, wherein the semiconductor layer comprises a pad region in which a conductive pad is disposed, and the conductive pad is connected to the interconnections of the interconnection layer, wherein the recess region extends from the light shielding pattern to the pad region, and the light shielding pattern and the conductive pad are spaced apart from each other in the recess region.

5. The image sensor of claim 1, wherein the semiconductor layer comprises a pad region in which a conductive pad is disposed that is connected to the interconnections of the interconnection layer, wherein the semiconductor layer has a pad recess region recessed from a surface of the semiconductor layer adjacent to the light penetration layer and separated from the recess region and wherein the conductive pad is formed in the pad recess region.

6. The image sensor of claim 1, wherein the semiconductor layer comprises a pad region in which a conductive pad is disposed and the conductive pad is connected to the interconnections of the interconnection layer, wherein the conductive pad is formed on a surface of the semiconductor layer adjacent to the light penetration layer.

7. The image sensor of claim 1, wherein the semiconductor layer comprises a light shielding region in which the light shielding pattern is disposed and a light receiving region spaced apart from the light shielding pattern, wherein a thickness of the semiconductor layer on the light shielding region is smaller than a thickness of the semiconductor layer on the light receiving region.

8. The image sensor of claim 7, wherein the semiconductor layer comprises a dummy region in which the photoelectrical transformation elements are formed between the light receiving region and the light shielding region, wherein the recess region extends from the light shielding region to the dummy region and one sidewall of the light shielding pattern adjacent to the light receiving region is disposed in the dummy region.

9. The image sensor of claim 8, wherein the light shielding pattern has a first part adjacent to the light receiving region and a second part spaced apart from the light receiving region, wherein a thickness of the first part is greater than a thickness of the second part.

10. The image sensor of claim 9, wherein the light shielding pattern comprises a horizontal part crossing the dummy region and the light shielding region and a vertical part vertically extending from the horizontal part to be adjacent to the photoelectrical transformation elements.

11. The image sensor of claim 1, further comprising:
a support substrate adhering to a surface of the interconnection layer spaced apart from the photoelectrical transformation element; and
an external connection terminal penetrating the support substrate to be connected to the interconnection of the interconnection layer.

12. The image sensor of claim 1, wherein the semiconductor layer is doped with an impurity of first conductivity type and comprises an impurity region of first conductivity type is conformally formed on a surface of the semiconductor layer adjacent to the light penetration layer, wherein an impurity concentration of the impurity region and is higher than that of the semiconductor layer.

13. An image sensor comprising:
a support substrate;
an interconnection layer adhered to the support substrate, the interconnection layer including a plurality of interlayer insulating layers and a plurality of metal interconnections which are vertically stacked in the interlayer insulating layers;
a semiconductor layer doped with an impurity of a first conductivity-type and having a first side and second side, the first side of the semiconductor layer being formed on interconnection layer, the semiconductor layer including device isolation layers defining active regions, a light receiving region, a light shielding region, a pad region, a plurality of photoelectrical transformation elements formed in the light shielding region on the first side of the semiconductor layer and a recess region formed in the semiconductor layer recessed from the second side of the semiconductor layer toward the interconnection layer and defined in the light shielding region and the pad region, wherein the photoelectrical transformation elements include an impurity region of a second conductivity-type different from the first conductivity-type and an impurity region of the first conductivity-type sequentially stacked in the semiconductor layer adjacent to the first side of semiconductor layer;
a light shielding pattern formed in at least a portion of the recess region defined in the light shielding region;
a conductive pad formed in a portion of the recess region defined in the pad region and spaced apart from the light shielding pattern;
a buffer insulating layer conformally formed on the second side of the semiconductor layer in which the recess region is defined;
a high concentration impurity layer slightly doped disposed along the second side of the semiconductor layer under the buffer insulating layer;
a light penetration layer disposed on the buffer insulating layer, the light penetration layer including a lower flat layer disposed on the buffer layer, a plurality of color filters disposed on the lower flat layer, an upper flat layer disposed on the color filters and a plurality of microlenses disposed on the upper flat layer; and
a buried layer formed between the lower flat layer of the light penetrating layer and the light shielding pattern formed in the recess region.

14. An image sensor comprising:
an interconnection layer including a plurality of interconnections which are vertically stacked;
a light penetration layer including a first flat layer, a plurality of color filters disposed on the first flat layer, and a plurality of microlenses disposed on the color filters;
a semiconductor layer between the interconnection layer and the light penetration layer, the semiconductor layer including a plurality of photoelectrical transformation elements; and
a light shielding pattern between the light penetration layer and the semiconductor layer, wherein a surface of the semiconductor layer adjacent to the light penetration layer having a recess region recessed toward the interconnection layer and wherein the light shielding pattern is formed in the recess region and at least one of the photoelectrical transformation elements is formed in the semiconductor layer between the light shielding pattern and the interconnection layer,
and wherein the first flat layer is disposed between the semiconductor layer and the color filters and wherein at least one of the microlenses overlaps with the light shielding pattern.

15. The image sensor of claim 14, wherein the first flat layer comprises a material having a refractive index greater than silicon oxide.

16. The image sensor of claim 15, wherein the light penetration layer further comprises a second flat layer disposed between the microlenses and the color filters and wherein the second flat layer comprises a material having a refractive index greater than silicon oxide.

17. The image sensor of claim 16, wherein the first flat layer and the second flat layer each comprise a material having a refractive index of about 1.4 to about 4.0.

* * * * *